United States Patent
Nagasaka

(10) Patent No.: US 9,256,137 B2
(45) Date of Patent: Feb. 9, 2016

(54) EXPOSURE APPARATUS, LIQUID HOLDING METHOD, AND DEVICE MANUFACTURING METHOD

(75) Inventor: Hiroyuki Nagasaka, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 700 days.

(21) Appl. No.: 13/593,079

(22) Filed: Aug. 23, 2012

(65) Prior Publication Data

US 2013/0059253 A1  Mar. 7, 2013

Related U.S. Application Data

(60) Provisional application No. 61/527,333, filed on Aug. 25, 2011.

(30) Foreign Application Priority Data

Jul. 9, 2012 (JP) .................................. 2012-153959

(51) Int. Cl.
G03B 27/52 (2006.01)
G03F 7/20 (2006.01)

(52) U.S. Cl.
CPC .................................. G03F 7/70341 (2013.01)

(58) Field of Classification Search
CPC .................................................. G03F 7/70341
USPC ................................................ 355/30, 72, 73
See application file for complete search history.

(56) References Cited

U.S. PATENT DOCUMENTS

| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,452,292 | B1 | 9/2002 | Binnard |
| 6,611,316 | B2 | 8/2003 | Sewell |
| 6,778,257 | B2 | 8/2004 | Bleeker et al. |
| 6,897,963 | B1 | 5/2005 | Taniguchi et al. |
| 2006/0038968 | A1* | 2/2006 | Kemper et al. .................. 355/18 |
| 2007/0132976 | A1 | 6/2007 | Nagasaka |

(Continued)

FOREIGN PATENT DOCUMENTS

EP  1 713 113 A1  10/2006
EP  1 768 170 A1  3/2007

(Continued)

OTHER PUBLICATIONS

Feb. 5, 2013 International Search Report issued in International Patent Application No. PCT/JP2012/072086.

(Continued)

*Primary Examiner* — Deoram Persaud
(74) *Attorney, Agent, or Firm* — Oliff PLC

(57) ABSTRACT

An exposure apparatus includes a first member disposed at least in a part of a periphery of an optical path of the exposure light, and has a first face that faces an upper face of the object through a first gap and holds the liquid between the upper face of the object and the first face, a second member disposed at an outer side of the first face with respect to the optical path and has a second face facing the upper face of the object through a second gap, a first supply port disposed at an outer side of the second face and supplies a fluid, and a first suction port disposed between the first face and the second face, and suctions at least part of gas in an outer space of the second member via a gap between the second face and the upper face of the object.

32 Claims, 12 Drawing Sheets

(56) References Cited

U.S. PATENT DOCUMENTS

| | | | |
|---|---|---|---|
| 2007/0177125 A1 | 8/2007 | Shibazaki | |
| 2007/0296939 A1* | 12/2007 | Nishii | G03F 7/70341 355/53 |
| 2008/0002169 A1* | 1/2008 | Hasegawa | G03F 7/70341 355/53 |
| 2008/0049209 A1 | 2/2008 | Nagasaka et al. | |
| 2008/0106718 A1* | 5/2008 | Okada | G03F 7/70341 355/67 |
| 2008/0212046 A1* | 9/2008 | Riepen | G03F 7/70341 355/30 |
| 2008/0233512 A1* | 9/2008 | Nishii | G03F 7/70341 430/117.32 |
| 2009/0046261 A1 | 2/2009 | Van Der Net | |
| 2009/0122283 A1* | 5/2009 | Hasegawa | G03F 7/70341 355/53 |
| 2010/0097584 A1 | 4/2010 | Doguchi | |
| 2010/0196832 A1 | 8/2010 | Nagasaka | |
| 2011/0134400 A1* | 6/2011 | Shibazaki | G03F 7/70341 355/30 |
| 2011/0222031 A1* | 9/2011 | Sato | G03F 7/70341 355/30 |
| 2012/0162619 A1* | 6/2012 | Sato | G03F 7/70341 355/27 |
| 2014/0022522 A1* | 1/2014 | Sato | G03F 7/70341 355/30 |
| 2014/0285781 A1* | 9/2014 | Sato | G03F 7/70341 355/30 |

FOREIGN PATENT DOCUMENTS

| | | |
|---|---|---|
| JP | A-2007-53193 | 3/2007 |
| WO | WO 01/35168 A1 | 5/2001 |
| WO | WO 2004/019128 A2 | 3/2004 |
| WO | WO 2012/091162 A1 | 7/2012 |
| WO | WO 2012/091163 A1 | 7/2012 |

OTHER PUBLICATIONS

Feb. 5, 2013 Written Opinion issued in International Patent Application No. PCT/JP2012/072086.

* cited by examiner

EXPOSURE APPARATUS, LIQUID HOLDING METHOD, AND DEVICE MANUFACTURING METHOD

CROSS-REFERENCE TO RELATED APPLICATION

This application is a non-provisional application claiming the benefit of U.S. provisional application No. 61/527,333, filed Aug. 25, 2011. This application also claims priority to Japanese Patent Application No. 2012-153959, filed Jul. 9, 2012. The entire contents of each of the applications identified above are incorporated herein by reference.

BACKGROUND

1. Field of the Invention

The present invention relates to an exposure apparatus, a liquid holding method, and a device manufacturing method.

2. Description of Related Art

Among exposure apparatuses used in photolithography, a liquid immersion exposure apparatus, for example, as disclosed in US Unexamined Patent Application, First Publication No. 2009/0046261, that exposes a substrate through liquid by exposure light is known.

SUMMARY

If liquid flows out from a predetermined space in a liquid immersion exposure apparatus, for example, there is a possibility that poor exposure may occur. As a result, there is a possibility that a defective device may be manufactured.

An object of an aspect of the invention is to provide an exposure apparatus and a liquid holding method that can suppress occurrence of poor exposure. In addition, an object of an aspect of the invention is to provide a device manufacturing method that can suppress generation of a defective device.

Means for Solving the Problem

According to a first aspect of the invention, there is provided an exposure apparatus that exposes a substrate with exposure light through liquid, including: a first member that is disposed at least in a part of a periphery of an optical path of the exposure light, and has a first face that faces an upper face of the object through a first gap and holds the liquid between the upper face of the object and the first face; a second member that is disposed at an outer side of the first face with respect to the optical path and has a second face facing the upper face of the object through a second gap; a first supply port that is disposed at an outer side of the second face with respect to the optical path and supplies a fluid; and a first suction port that is disposed between the first face and the second face, and suctions at least part of gas in an outer space of the second member with respect to the optical path via a gap between the second face and the upper face of the object.

According to a second aspect of the invention, there is provided an exposure apparatus that exposes a substrate with exposure light through a first liquid of a first liquid immersion space, including: an optical member having an emission face from which the exposure light is emitted; a first liquid immersion member that is disposed at at least part of a periphery of an optical path of the exposure light and forms the first liquid immersion space of the first liquid; and a second liquid immersion member that is disposed at an outer side of the first liquid immersion member with respect to the optical path, and is capable to form a second liquid immersion space of a second liquid separated from the first liquid immersion space, wherein the second liquid immersion member has a first face that is opposed to an upper face of an object through a first gap and holds the liquid between the upper face of the object and itself, a second face that is disposed at an outer side of the first face with respect to a center of the first face and opposed to the upper face of the object through a second gap, a first supply port that is disposed at an outer side of the second face with respect to the center of the first face and supplies fluid, and a first suction port that is disposed between the first face and the second face, and suctions at least part of gas in an outer space of the second face through a gap between the second face and the upper face of the object.

According to a third aspect of the invention, there is provided a device manufacturing method including exposing a substrate using the exposure apparatus according to the first aspect or the second aspect and developing the exposed substrate.

According to a fourth aspect of the invention, there is provided a liquid holding method used in an exposure apparatus that causes a substrate to be exposed to exposure light via liquid over the substrate, including holding the liquid between the upper face of the substrate and a first face of the first member that is disposed at least in a part of the periphery of the optical path of the exposure light and faces the upper face of the substrate via a first gap, supplying a fluid from a first supply port that is disposed on the outer side of a second face of a second member that is disposed on the outer side of the first face with respect to the optical path and faces the upper face of the substrate via a second gap, and suctioning at least part of gas in an outer space of the second member with respect to the optical path from a first suction port disposed between the first face and the second face via a gap between the fluid flowing over the second face and the upper face of the substrate.

According to a fifth aspect of the invention, there is provided a device manufacturing method including exposing a substrate via at least part of liquid held using the liquid holding method according to the fourth aspect, and developing the exposed substrate.

According to the aspects of the invention, the occurrence of poor exposure can be suppressed. In addition, according to the aspects of the invention, the generation of a defective device can be suppressed.

DESCRIPTION OF EMBODIMENTS

Hereinafter, embodiments of the invention will be described with reference to drawings, however, the invention is not limited thereto. In description below, an XYZ orthogonal coordinate system will be set, and positional relationships between respective units will be described referring to the XYZ coordinate system. A predetermined direction within a horizontal plane is set as an X-axis direction, the direction orthogonal to the X-axis direction within the horizontal plane is set as a Y-axis direction, and the direction orthogonal to each of the X-axis direction and the Y-axis direction is set as a Z-axis direction (vertical direction). In addition, rotational (inclining) directions around the X, Y, and Z axes are respectively set as θX, θY, and θZ directions.

First Embodiment

Figure 1:
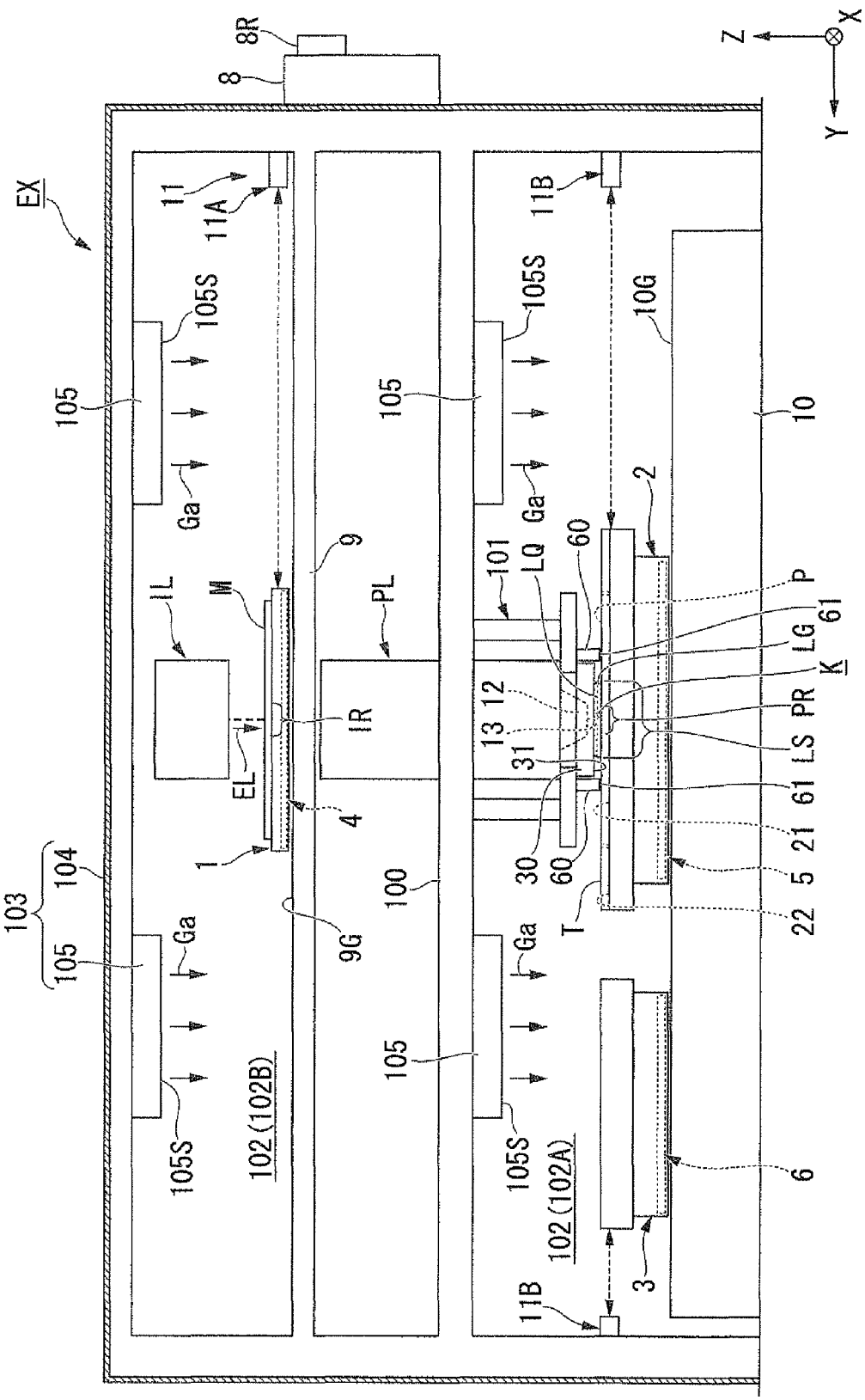
FIG. 1 is an outline configuration diagram showing an example of an exposure apparatus according to a first embodiment of the invention.

A first embodiment will be described. FIG. 1 is an outline configuration diagram showing an example of an exposure apparatus EX according to the first embodiment of the invention. The exposure apparatus EX of the present embodiment is a liquid immersion exposure apparatus that exposes a substrate P through liquid LQ by exposure light EL. In the present embodiment, a liquid immersion space LS is formed so that at least a part of an optical path of the exposure light EL is filled with the liquid LQ. The liquid immersion space refers to a portion (a space or an area) filled with liquid. The substrate P is exposed through the liquid LQ in the liquid immersion space LS by the exposure light EL. In the present embodiment, water (pure water) is used as the liquid LQ.

In addition, the exposure apparatus EX of the present embodiment is an exposure apparatus including a substrate stage and a measurement stage as disclosed in, for example, U.S. Pat. No. 6,897,963 and European Unexamined Patent Application Publication No. 1713113.

In FIG. 1, the exposure apparatus EX is provided with a mask stage 1 that can move while holding a mask M, a substrate stage 2 that can move while holding the substrate P, a measurement stage 3 that can move while having a measurement member and a measurement apparatus for measuring the exposure light EL is mounted thereof, and without holding the substrate P, a drive system 4 that moves the mask stage 1, a drive system 5 that moves the substrate stage 2, a drive system 6 that moves the measurement stage 3, an illumination system IL that illuminates the mask M with the exposure light EL, a projection optical system PL that projects an image of the pattern of the mask M illuminated with the exposure light EL onto the substrate P, a first member 30 that is disposed at least in a part of the periphery of the optical path of the exposure light EL and has a first face 31 that faces the upper face of an object via a first gap, and that holds the liquid LQ against the upper face of the object, second members 60 that are disposed at the outer sides of the first face 31 with respect to the optical path of the exposure light EL, and that have second faces 61 facing the upper face of the object via a second gap, an interferometer system 11 that measures positions of the mask stage 1, the substrate stage 2, and the measurement stage 3, a control apparatus 8 that controls the entire operations of the exposure apparatus EX, and a storage apparatus 8R that is connected to the control apparatus 8 and stores various kinds of information relating to exposure. The storage apparatus 8R includes, for example memories such as a RAM, and the like, and storage media such as a hard disk, a CD-ROM, and the like. In the storage apparatus 8R, an operating system (OS) for controlling a computer system is installed, and programs for controlling the exposure apparatus EX are stored.

The mask M includes a reticle on which a device pattern to be projected onto the substrate P is formed. The mask M includes, for example, a transparent plate such as a glass plate, or the like, and a transmissive mask having a pattern formed by using a light-blocking material such as chrome on such a transparent plate. Furthermore, as a mask M, a reflective mask can also be used.

The substrate P is a substrate for manufacturing a device. The substrate P includes, for example, a base material such as a semiconductor wafer, or the like, and a photosensitive film formed on the base material. The photosensitive film is a film of a photosensitive material (photoresist). In addition, the substrate P may include another film in addition to the photosensitive film. For example, the substrate P may include a reflection-preventive film, or a protective film (a top-coated film) for protecting the photosensitive film.

In addition, the exposure apparatus EX is provided with a body 100 that supports at least the projection optical system PL. Furthermore, the exposure apparatus EX is provided with a chamber apparatus 103 that adjusts the environment (at least one of temperature, humidity, pressure, and the degree of cleaning) of a space 102 through which the exposure light EL travels. The chamber apparatus 103 has a chamber member 104 that forms the space 102 and environment control apparatuses 105 that adjust the environment of the space 102. The space 102 is an inner space that the chamber member 104 forms. The body 100 is disposed at the space 102.

The space 102 includes a space 102A and a space 102B. The space 102A is a space where the substrate P is processed. The substrate stage 2 and the measurement stage 3 move within the space 102A.

The environment control apparatuses 105 have air supply portions 105S that supply gas Ga to the spaces 102A and 102B, and the air supply portion 105S supplies the gas Ga to the spaces 102A and 102E so as to adjust the environment of the spaces 102A and 102B. In the present embodiment, at least the substrate stage 2, the measurement stage 3, and a last optical element 12 of the projection optical system PL are disposed at the space 102A. In the present embodiment, the gas Ga supplied from the environment control apparatus 105 to the space 102 is air.

The illumination system IL irradiates a predetermined illumination region IR with the exposure light EL. The illumination region IR includes a position that can be irradiated with the exposure light EL emitted from the illumination system IL. The illumination system IL illuminates at least a part of the mask M disposed at the illumination region IR with the exposure light EL with uniform illuminance distribution. As the exposure light EL emitted from the illumination system IL, for example, deep ultraviolet light (DUV light) such as bright lines (g-line, h-line, and i-line) emitted from a mercury lamp and KrF excimer laser light (wavelength of 248 nm), vacuum ultraviolet light (VUV light) such as ArF excimer laser light (wavelength of 193 nm) and $F_2$ laser light (wavelength of 157 nm), and the like. In the present embodiment, as the exposure fight EL, ArF excimer laser light that is ultraviolet light (vacuum ultraviolet light) is used.

The mask stage 1 can move on a guide surface 9G of a base member 9 including the illumination region IR in a state of holding the mask M. The drive system 4 includes a planar motor for causing the mask stage 1 to move on the guide surface 9G. The planar motor has a moving member disposed on the mask stage 1 and a stationary member disposed at the base member 9, for example, as disclosed in the specification of U.S. Pat. No. 6,452,292. In the present embodiment, the mask stage 1 can move in the six directions of the X axis, Y axis, Z axis, θX, θY and θZ directions on the guide surface 9G by the operation of the drive system 4.

The projection optical system PL irradiates a predetermined projection region PR with the exposure light EL. The projection region PR includes a position that can be irradiated with the exposure light EL emitted from the projection optical system PL. The projection optical system PL projects an image of the pattern of the mask M onto at least a portion of the substrate P disposed at the projection region PR with a predetermined projection magnification. The projection optical system PL of the present embodiment has projection magnifications of, for example, a reduction system of ¼, ⅕, ⅛, or the like. Furthermore, the projection optical system PL may be any one of an equal magnification system and an enlargement system. In the present embodiment, the optical axis of the projection optical system PL is parallel to the Z axis. In addition, the projection optical system PL may be any one of a refractive system that does not include a reflective optical element, a reflective system that does not include a refractive optical element, and a reflective refractive system that includes both a reflective optical element and a refractive optical element. In addition, the projection optical system PL may form any one of an inverted image and an erect image.

The substrate stage 2 can move to a position (projection region PR) that can be irradiated with the exposure light EL emitted from the projection optical system PL. The substrate stage 2 can move on a guide surface 10G of a base member 10 including the projection region PR, in a state of holding the substrate P. The measurement stage 3 can move to a position (projection region PR) that can be irradiated with the exposure light EL emitted from the projection optical system PL. The measurement stage 3 can move on the guide surface 10G of the base member 10 including the projection region PR, in a state of holding the measurement member. The substrate stage 2 and the measurement stage 3 can independently move on the guide surface 100.

The drive system 5 for causing the substrate stage 2 to move includes a planar motor for causing the substrate stage 2 to move on the guide surface 10G. The planar motor has a moving member disposed on the substrate stage 2 and a stationary member disposed at the base member 10, for example, as disclosed in U.S. Pat. No. 6,452,292, In a similar manner, the drive system 6 for causing the measurement stage 3 to move includes a planar motor and has a moving member disposed on the measurement stage 3 and a stationary member disposed at the base member 10.

In the present embodiment, the substrate stage 2 has a first holding section 21 that releasably holds the lower surface of the substrate P, and a second holding section 22 that is disposed at the vicinity of the first holding section 21 and releasably holds the lower surface of a cover member T, as disclosed in, for example, US Unexamined Patent Application Publication Nos. 2007/0177125 and 2008/0049209. The cover member T is disposed at the vicinity of the substrate P held by the first holding section 21.

In the present embodiment, the first holding section 21 holds the substrate P. The second holding section 22 holds the cover member T. In the present embodiment, the upper face of the substrate P held by the first holding section 21 and the upper face of the cover member T held by the second holding member 22 are disposed substantially within the same plane (are substantially flush with each other).

Furthermore, the cover member T may be formed as a single unit with the substrate stage 2. In this case, the second holding section 22 is omitted.

The interferometer system 11 includes a laser interferometer unit 11A that measures a position of the mask stage 1, and a laser interferometer unit 11B that measures the position of the substrate stage 2 and the measurement stage 3. The laser interferometer unit 11A can measure a position of the mask stage 1 using a measurement mirror disposed at the mask stage 1. The laser interferometer unit 11B can measure each position of the substrate stage 2 and the measurement stage 3 using a measurement mirror disposed at the substrate stage 2 and another measurement mirror disposed at the measurement stage 3.

When an exposure process of the substrate P is to be executed, or when a predetermined measurement process is to be executed, the control apparatus 8 causes the drive systems 4, 5, and 6 to operate and executes position control of the mask stage 1 (mask M), the substrate stage 2 (substrate P), and the measurement stage 3 (measurement member C) based on measurement results of the interferometer system 11.

The first member 30 can form the liquid immersion space LS so that at least a part of the optical path of the exposure light EL is filled with the liquid LQ. The first member 30 is disposed at the vicinity of the last optical element 12 among a plurality of optical elements of the projection optical system PL, which is the closest to the projection optical system PL. In the present embodiment, the first member 30 is a circular shape, and disposed at the periphery of the optical path of the exposure light EL. In the present embodiment, at least a part of the first member 30 is disposed at the periphery of the last optical element 12.

The last optical element 12 has an emission face 13 that emits the exposure light EL toward the image plane of the projection optical system PL. In the present embodiment, the liquid immersion space LS is formed on the emission face 13 side. The liquid immersion space LS is formed so that the optical path K of the exposure light EL emitted from the emission face 13 is filled with the liquid LQ. The exposure light EL emitted from the emission face 13 travels to the −Z direction. The emission face 13 faces the traveling direction (−Z direction) of the exposure light EL. In the present embodiment, the emission face 13 is a plane substantially parallel to the X-Y plane. Furthermore, the emission face 13 may be inclined to the X-Y plane, or may include a curved surface.

The first member 30 has a first face 31 at least a part of which faces the −Z direction. In the present embodiment, the emission face 13 and the first face 31 can hold the liquid LQ between an object disposed at the position (projection region PR) that can be irradiated with the exposure light EL emitted from the emission face 13. The liquid immersion space LS is formed by the liquid LQ held between at least a part of the emission face 13 and the first face 31 and the object disposed at the projection region PR. The liquid immersion space LS is formed in such a way that the optical path K of the exposure light EL between the emission face 13 and the object disposed at the projection region PR is filled with the liquid LQ. The first member 30 can hold the liquid LQ between the object in such a way that the optical path K of the exposure light EL between the last optical element 12 and the object is filled with the liquid LQ.

In the present embodiment, an object that can be disposed at the projection region PR includes an object that can move in the projection region PR to the image plane side (the side of the emission face 13 of the last optical element 12) of the projection optical system PL. The object can move with respect to the last optical element 12 and the first member 30. The object has an upper face (surface) that can face at least any one of the emission face 13 and the first face 31. The upper face of the object can form the liquid immersion space LS between itself and the emission face 13. In the present embodiment, the upper face of the object can form the liquid immersion space LS between itself and at least a part of the emission face 13 and the first face 31. By the liquid LQ being held between the emission face 13 and the first face 31 on one side and the upper face (surface) of the object on the other side, the liquid immersion space LS is formed so that the liquid LQ fills the optical path K of the exposure light EL between the last optical element 12 and the object.

In the present embodiment, the object includes at least one of the substrate stage 2, the substrate P held on the substrate stage 2, the measurement stage 3, and the measurement member held on the measurement stage 3. For example, the upper face of the substrate stage 2 (cover member T) and the surface (upper face) of the substrate P held on the substrate stage 2 can face the emission face 13 of the last optical element 12 which faces toward the −Z direction, and can face the first face 31 of the first member 30 which faces toward the −Z direction. Of course, an object that can be disposed at the projection region PR is not limited to at least one of the substrate stage 2, the substrate P held on the substrate stage 2, the measurement stage 3, and the measurement member held on the measurement stage 3. In other words, the liquid immersion space LS may be formed over two or more objects.

In addition, in the embodiment, the object that can be disposed at the projection region PR can face at least a part of the second member 60. The object can face a second face 61 of the second member 60. Furthermore, in the present embodiment, the first member 30 and the second member 60 are provided as a single unit.

In the present embodiment, when the substrate P is irradiated with the exposure light EL, the liquid immersion space LS is formed in such a way that a partial region of the surface of the substrate P which included the projection region PR is covered with the liquid LQ. During the exposure of the substrate P, the first member 30 can hold the liquid LQ between itself and the substrate P so that the optical path K of the exposure light EL between the last optical element 12 and the substrate P is filled with the liquid LQ. At least a part of an interface (a meniscus or an edge) LG of the liquid LQ is formed between the first face 31 of the first member 30 and the surface of the substrate P. In other words, the exposure apparatus EX of the present embodiment employs a local immersion method.

In the present embodiment, the body 100 supports the first member 30 and the second member 60. In the present embodiment, the body 100 supports the first and the second members 30 and 60 via a supporting mechanism 101. In the present embodiment, the position of the supporting mechanism 101 (body 100) is substantially fixed. The upper face of the object faces the first face 31 of the first member 30 through the first gap and faces the second face 61 of the second member 60 through the second gap.

Figure 2:
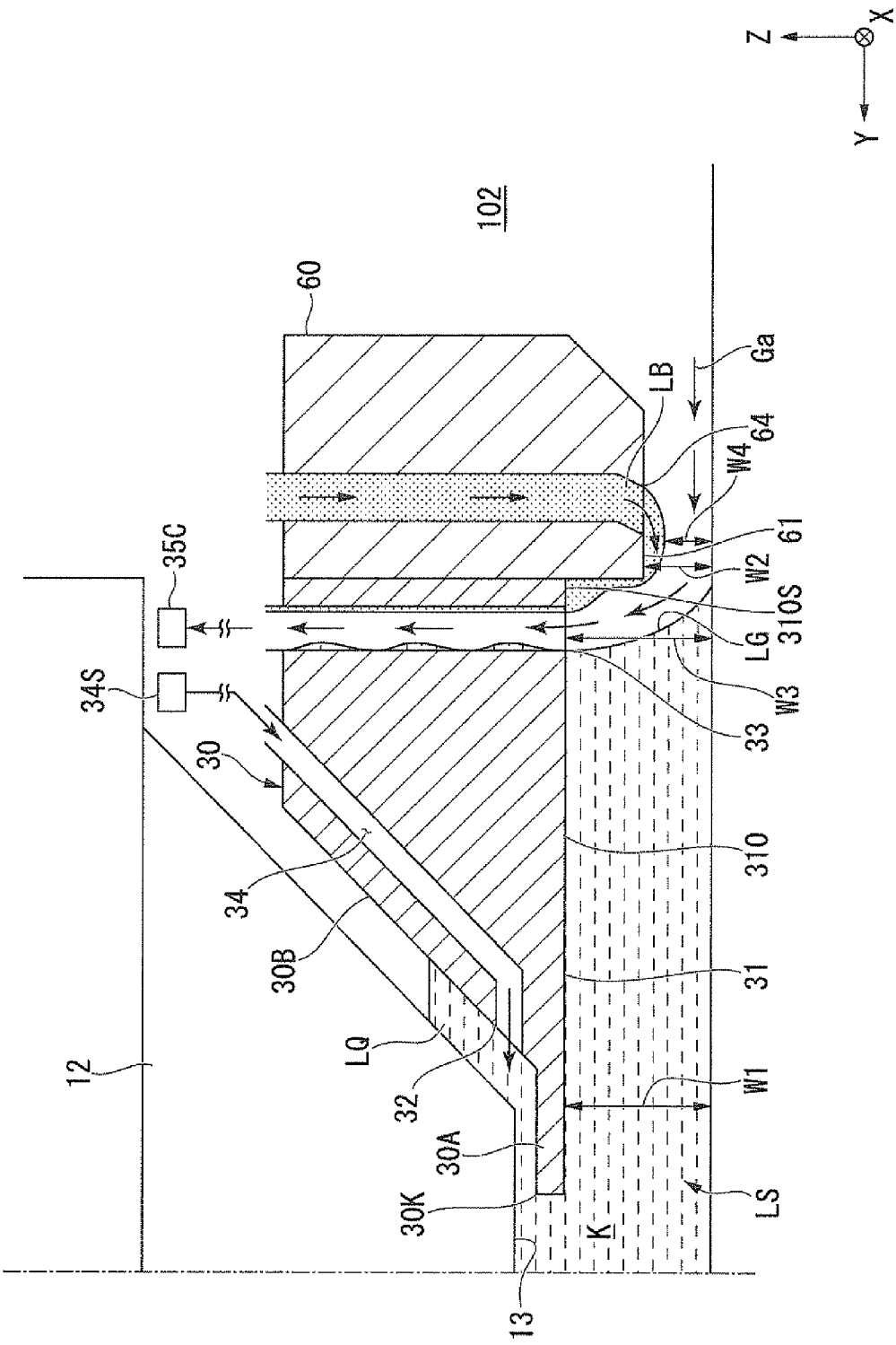
FIG. 2 is a diagram showing a part of the exposure apparatus according to the first embodiment of the invention.

FIG. 2 is a diagram showing the vicinity of the first member 30 and the second member 60 according to the present embodiment. Furthermore, in FIG. 2, the substrate P is disposed at the projection region PR (a position facing the last optical element 12, the first member 30, and the second member 60). However, as described above, the substrate stage 2 (cover member T), the measurement stage 3 (measurement member), or the like can be disposed therein.

As shown in FIG. 2, the first member 30 includes a facing portion 30A, at least a part of which faces the emission face 13 of the last optical element 12, and a main body section 30B, at least a part of which is disposed at the periphery of the last optical element 12. The facing portion 30A has a hole (opening) 30K facing the emission face 13. The facing portion 30A has an upper face, at least a part of which faces the emission face 13 through a gap.

The first member 30 has a lower face 310 that can face the substrate P (object). The opening 30K is formed so as to connect the upper face of the facing portion 30A and the lower face 310. The upper face of the facing portion 30A is disposed at the periphery of the upper end of the opening 30K and the lower face 310 thereof is disposed at the periphery of the lower end of the opening 30K. The exposure light EL emitted from the emission face 13 can be irradiated on the substrate P through the opening 30K.

In the present embodiment, each of the upper face and the lower face 310 of the facing portion 30A are disposed at the periphery of the optical path K. In the present embodiment, the upper face of the facing portion 30A is flat. In the present embodiment, the lower face 310 is flat. The lower face 310 includes the first face 31 between the substrate P (object) that can hold the liquid LQ. In the present embodiment, the lower face 310 (the first face 31) is a plane that is substantially parallel to the X-Y plane. Furthermore, the lower face 310 (first face 31) may be inclined to the X-Y plane, or may include a curved face.

In addition, the first member 30 has a supply port 32 that can supply the liquid LQ and a recovery port 33 that can recover the liquid LQ. The supply port 32 supplies the liquid LQ during, for example, the exposure of the substrate P. The recovery port 33 recovers the liquid LQ during, for example, the exposure of the substrate P. Furthermore, the supply port 32 can supply the liquid LQ during both or either of the exposure and/or non-exposure of the substrate P. Furthermore, the recovery port 33 can recover the liquid LQ during both or either of the exposure and/or non-exposure of the substrate P.

The supply port 32 is disposed at the vicinity of the optical path K of the exposure light EL emitted from the emission face 13 so as to face the optical path K. Furthermore, it is only necessary for the supply port 32 to face both or either one of a space between the emission face 13 and the opening 30K and/or a side face of the last optical element 12. In the present embodiment, the supply port 32 supplies the liquid LQ to a space between the upper face of the facing portion 30A and the emission face 13. The liquid LQ supplied from the supply port 32 flows in the space between the upper face of the facing portion 30A and the emission face 13, and then is supplied onto the substrate P (object) via the opening 30K.

Furthermore, the supply port 32 may be disposed at the lower face 310. In other words, the supply port 32 may be disposed so as to face the object. Moreover, in addition to the supply port 32, another liquid supply port may be disposed at the lower face 310.

The supply port 32 is connected to a liquid supply apparatus 34S via a flow path 34. The liquid supply apparatus 34S can send the liquid LQ that is clean and of which a temperature is adjusted. At least a part of the flow path 34 is formed inside the first member 30. The liquid LQ sent from the liquid supply apparatus 34S is supplied to the supply port 32 via the flow path 34. The supply port 32 supplies the liquid LQ at least during the exposure of the substrate P.

The recovery port 33 can recover at least part of the liquid LQ on the object facing the lower face 310 of the first member 30. The recovery port 33 is disposed at at least part of the opening 30K through which the exposure light EL passes. In the present embodiment, the recovery port 33 is disposed at at least part of the periphery of the first face 31 in the lower face 310 that can hold the liquid LQ between the object. In other words, in the present embodiment, the lower face 310 includes a first face 31 that is disposed at the inner side of the recovery port 33 and can form a liquid immersion space LS by holding the liquid LQ between the object and a face 310S that is disposed at the outer side of the recovery port 33. The recovery port 33 is disposed so as to face the object. The recovery port 33 is disposed at a predetermined position of the first member 30 facing the surface of the object. At least during the exposure of the substrate P, the substrate P faces the recovery port 33. During the exposure of the substrate P, the recovery port 33 recovers the liquid LQ on the substrate P.

The recovery port 33 is connected to a fluid recovery apparatus 35C via the flow path 35. The fluid recovery apparatus 35C can connect the recovery port 33 to a vacuum system and is able to suction the liquid LQ via the recovery port 33 and the flow path 35. In addition, the fluid recovery apparatus 35C is able to suction gas via the recovery port 33 and the flow path 35. At least a part of the flow path 35 is formed inside the first member 30. Both or either one of the liquid LQ and/or gas recovered (suctioned) from the recovery port 33 is recovered (suctioned) to the fluid recovery apparatus 35C via the flow path 35.

In the present embodiment, the control apparatus 8 can form the liquid immersion space LS with the liquid LQ between the last optical element 12 and the first member 30 on one side and the object on the other side by performing a recovery operation of the liquid LQ from the recovery port 33 in parallel with a supply operation of the liquid LQ from the supply port 32.

Furthermore, as the first member 30, a liquid immersion member (nozzle member) as disclosed in, for example, US Unexamined Patent Application Publication No. 2007/0132976 and European Unexamined Patent Application Publication No. 1768170 can be used.

The second member 60 has the second face 61 that can face the substrate P (object). In the present embodiment, the second face 61 is disposed at the periphery of the optical path K and the first member 30. In the present embodiment, the second face 61 is flat, and parallel to the X-Y plane. Furthermore, the second face 61 may be inclined to the X-Y plane, or may include a curved face. In addition, in the present embodiment, on the second face 61 of the second member 60, a suction port is not provided.

As shown in FIG. 2, in the present embodiment, the first gap W1 is formed between the first face 31 and the upper face of the substrate P (upper face of the object). The second gap W2 is formed between the second face 61 and the upper face of the substrate P (upper face of the object). In the present embodiment, a dimension of the second gap W2 is smaller than a dimension of the first gap W1.

In the present embodiment, the recovery port 33 is disposed between the first face 31 and the second face 61. The recovery port 33 is disposed so as to face the substrate P (object). In the present embodiment, a dimension of a third gap W3 disposed between the recovery port 33 and the upper face of the substrate P (upper face of the object) is larger than those of the second gap W2. The first gap W1 is 0.5 mm to 1.0 mm. The second gap W2 is 0.3 mm to 0.4 mm. In the present embodiment, the first gap W1 is 1.0 mm, and the second gap W2 is 0.3 mm.

In the present embodiment, the dimensions of the first gap W1 and the third gap W3 are substantially the same. Furthermore, the dimension of the first gap W1 may be greater or smaller than a dimension of the third gap W3.

In the present embodiment, the second member 60 is disposed at the outer side of the second face 61 with respect to the optical path K, and provided with a supply port 64 that supplies liquid LB. In the present embodiment, the liquid LB is water as the liquid LQ is.

In the present embodiment, the liquid LB supplied from the supply port 64 may be different from the liquid LQ through which the exposure light EL passes. For example, the liquid LB supplied from the supply port 64 may have higher viscosity that the liquid LQ through which the exposure light EL passes. For example, the liquid LQ may be water, and the liquid LB may be decalin. Furthermore, the liquid LB may be a different grade of cleanness from that of the liquid LQ. For example, the liquid LQ may be water with a first grade of cleanness and the liquid LB may be water with a second grade of cleanness that is lower than the first grade of cleanness. In addition, the liquid LB may be water with different temperature from that of the liquid LQ. For example, the liquid LQ may be water with a first temperature, and the liquid LB may be water with a second temperature that is higher than the first temperature.

In the present embodiment, the liquid LB supplied from the supply port 64 flows on the second face 61 toward the optical path K. In the present embodiment, the liquid LB supplied from the supply port 64 flows while coming into contact with at least a part of the second face 61 and with at least a part of the face 310S, and then is recovered (suctioned) from the recovery port 33. In the present embodiment, a film of the liquid LB is formed at the second face 61 and the face 310S.

In the present embodiment, the recovery port 33 suctions (discharges) at least part of gas in the space on the outer side of the second member 60 with respect to the optical path K via the gap between the second face 61 and the upper face of the object.

In the present embodiment, the space on the outer side of the second member 60 with respect to the optical path K is a space 102 (102A) formed by the chamber member 104. The recovery port 33 suctions at least part of the gas Ga from the environment control apparatus 105 via the second gap W2.

The recovery port 33 suctions the gas Ga in the space on the outer side of the second member 60 via a fourth gap W4 formed between the surface (lower face) of the liquid LB that is supplied from the supply port 64 and flows on the second face 61 and the upper face of the object. In other words, the gas Ga suctioned from the recovery port 33 passes through the gap between the liquid LB flowing on the second face 61 and the upper face of the object (substrate P).

In the present embodiment, in order to make the liquid LB supplied from the supply port 64 flow on the second face 61 without coming into contact with the upper face of the facing object, at least either of a liquid supply amount of the liquid LB supplied from the supply port 64 per unit time and a gas recovery amount of gas recovered from the recovery port 33 per unit time is set. In other words, in order to form the fourth gap W4 between the liquid LB flowing on the second face 61 and the upper face of the facing object, at least either of the liquid supply amount of the liquid LB supplied from the supply port 64 per unit time and the gas recovery amount of gas recovered from the recovery port 33 per unit time is set.

In the present embodiment, a dimension of the fourth gap W4 between the surface of the liquid LB and the upper face of the object is 0.2 mm or less. For example, the dimension of the fourth gap W4 between the surface of the liquid LB and the upper face of the object is 0.1 mm or greater and 0.2 mm or less.

In the present embodiment, the dimension of the fourth gap W4 between the surface of the liquid LB and the upper face of the object is smaller than those of the first gap W1 and the second gap W2.

In addition, in the present embodiment, the dimension of the third gap W3 between the recovery port 33 and the upper face of the object is larger than that of the fourth gap W4 between the surface of the liquid LB and the upper face of the object.

As described above, in the present embodiment, the recovery port 33 can also suction at least part of the liquid LQ supplied between the first face 31 and the upper face of the object. For example, during the exposure of the substrate P, the recovery port 33 can suction both of the liquid LQ and the gas Ga. As shown in FIG. 2, the fluid recovery apparatus 35C suctions the liquid LQ via the recovery port 33 so that the passage of the gas Ga is maintained in the flow path 35.

In addition, in the present embodiment, the recovery port 33 can suction the liquid LB and the gas Ga together. As shown in FIG. 2, the fluid recovery apparatus 35C suctions the liquid LB via the recovery port 33 so that the passage of the gas Ga is maintained in the flow path 35.

Furthermore, in the present embodiment, the positions of the first member 30 and second member 60 are substantially fixed. However, a drive apparatus may be provided which moves the first member 30 and the second member 60 in at least one direction of six directions of the X-axis, Y-axis, Z-axis, θX, θY, and θZ directions.

Next, an example of a method for exposing the substrate P by using the exposure apparatus EX will be described. In order to expose the substrate P, the liquid immersion space LS is formed with the liquid LQ above the substrate P held by the first holding section 21. In order to form the liquid immersion space LS, the control apparatus 8 supplies the liquid LQ from the supply port 32 and recovers the liquid LQ from the recovery port 33 in a state in which the last optical element 12 and the first member 30 face the substrate P (substrate stage 2). In the present embodiment, the interface LG of the liquid LQ in the liquid immersion space LS is formed on, for example, further inner side than the recovery port 33. In the example shown in FIG. 2, the interface LG of the liquid LQ in the liquid immersion space LS is formed, for example, so as to connect the outer edge of the first face 31 and the upper face of the substrate P.

The control apparatus 8 controls the fluid recovery apparatus 35C to suction the liquid LQ from the recovery port 33 so that the passage of the gas Ga is maintained in the flow path 35. In other words, the fluid recovery apparatus 35C is controlled so that the liquid LQ and the gas Ga are recovered (suctioned) together at all times from the recovery port 33. Furthermore, if the passage of the gas Ga is maintained in the flow path 35, the liquid LQ may not be recovered at all times, but for example, may be intermittently recovered.

In addition, in the present embodiment, the liquid LB is supplied from the supply port 64 at least when the liquid immersion space LS is formed. In the present embodiment, the supply of liquid LB from the supply port 64 is started at least after a suction operation from the recovery port 33 is started.

The liquid LB supplied from the supply port 64 is suctioned from the recovery port 33. The control apparatus 8 controls the fluid recovery apparatus 35C to suction the liquid LB from the recovery port 33 so that the passage of the gas Ga is maintained in the flow path 35. In other words, the fluid recovery apparatus 35C is controlled so that the liquid LB and the gas Ga are always recovered (suctioned) together with each other from the recovery port 33.

After the liquid immersion space LS is formed by the liquid LQ between, the last optical element 12 and the first member 30, and the substrate P (substrate stage 2), the control apparatus 8 starts an exposure process of the substrate P.

The exposure apparatus EX of in the present embodiment is a scanning type exposure apparatus (so-called scanning stepper) that projects an image of a pattern of the mask M onto the substrate P while moving the mask M and the substrate P to a predetermined scanning direction in a synchronized manner. In the present embodiment, the scanning direction (synchronized movement direction) of the substrate P is set to the Y-axis direction, and the scanning direction (synchronized movement direction) of the mask M is also set to the Y-axis direction. The control apparatus 8 moves the substrate P in the Y-axis direction of the projection region PR of the projection optical system PL at a predetermined scanning rate, and irradiates the substrate P with the exposure light EL via the liquid LQ in the liquid immersion space LS between the projection optical system PL and over the substrate P while moving the mask M in the Y-axis direction in the illumination region IR of the illumination system IL at a predetermined scanning rate, in synchronization with the movement of the substrate P in the Y-axis direction. Accordingly, the substrate P is exposed to the exposure light EL via the liquid LQ, and an image of the pattern of the mask M is projected onto the substrate P through the projection optical system PL and the liquid LQ.

In the present embodiment, at least during the exposure of the substrate P, the gas Ga in the space on the outer side of the second member 60 is continuously suctioned from the recovery port 33 via the second gap W2. Accordingly, the liquid LQ in the liquid immersion space LS is controlled such that it does not flow out to the outer side from the space between the first face 31 and the upper face of the substrate P (object) even when, for example, the substrate P (object) is moved in the state where the liquid immersion space LS is formed.

In the present embodiment, a difference between pressure in the space on the outer side of the second member 60 and pressure in the space on the inner side thereof is caused by at least part of gas in the space on the outer side of the second member 60 with respect to the optical path K being suctioned from the recovery port 33 formed on the inner side of the second member 60 via the second gap W2 (fourth gap W4). For example, pressure in the space on the inner side of the second member 60 (the space in the vicinity of the recovery port 33 or the space in the periphery of the interface LG) becomes lower than that in the space on the outer side of the second member 60. In other words, the pressure in the space on the inner side of the second gap W2 (fourth gap W4) with respect to the optical path of the exposure light becomes lower than the pressure in the space on the outer side of the second gap W2 (fourth gap W4) with respect to the optical path of the exposure light. In addition, a flow of gas from the outer side of the interface LG to the interface LG is generated by suctioning the gas in the space on the outer side of the second member 60 via the second gap W2 (fourth gap W4) by the recovery port 33.

In the present embodiment, the dimension of the second gap W2 is sufficiently smaller than the dimension of the first gap W1. The dimension of the fourth gap W4 is sufficiently smaller than those of the first gap W1 and the second gap W2. For this reason, a difference in pressure between the spaces on the outer side and the inner side of the second member 60 increases by the gas Ga in the space on the outer side of the second member 60 with respect to the optical path K being suctioned from the recovery port 33 via the second gap W2 (fourth gap W4). In other words, a difference between the pressure in the inner space between the second gap W2

(fourth gap W4) and the liquid immersion space LS, and the pressure in the outer space that is on the opposite side to the inner space of the second gap W2 (fourth gap W4) increases.

Accordingly, the outflow of the liquid LQ in the liquid immersion space LS is suppressed.

As described above, according to the present embodiment, since at least part of the gas Ga in the outer space of the second member 60 with respect to the optical path K is designed to be suctioned from the recovery port 33 disposed at the inner space of the second member 60 via the second gap W2 (fourth gap W4), a difference in pressure and a flow of gas are generated which suppresses the outflow of the liquid LQ of the liquid immersion space LS at the periphery of the interface LG of the liquid immersion space LS. Therefore, it is possible to suppress occurrence of poor exposure and a defective device.

In addition, since the fourth gap W4 that is smaller than the second gap W2 is formed by, for example, causing the liquid LB to flow, a difference in pressure between the outer and inner space of the second member 60 existing when a suctioning operation on the recovery port 33 is executed can be set larger than that existing when the liquid LB does not flow, and the outflow of the liquid LQ in the liquid immersion space LS occurring at the periphery of the interface LG of the liquid immersion space LS is suppressed.

Second Embodiment

Next, a second embodiment will be described. In the following description, the same reference symbols are given to the same or equivalent constituent components as those in the above-described embodiment, and description thereof will be simplified or omitted.

Figure 3:
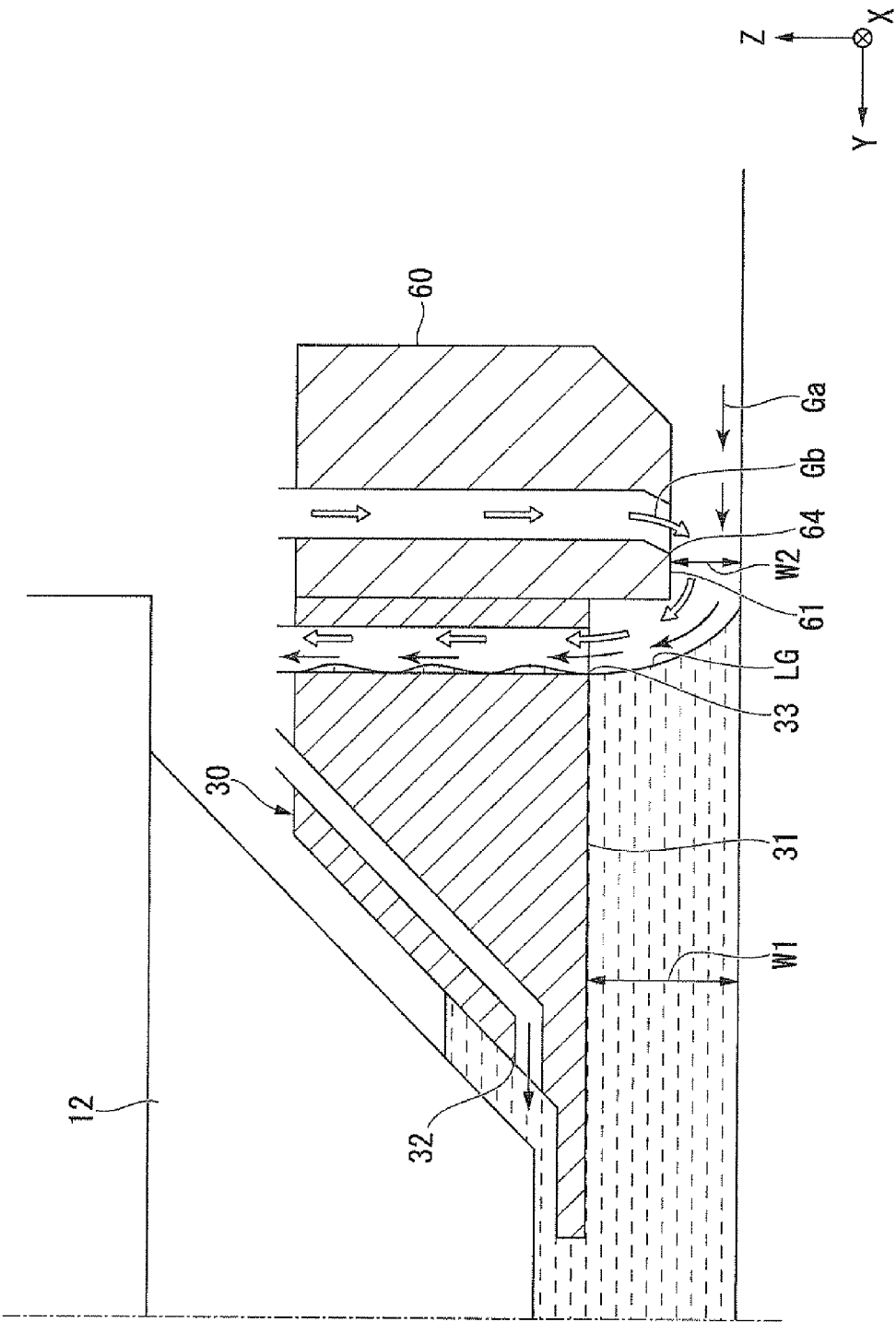
FIG. 3 is a diagram showing a part of an exposure apparatus according to a second embodiment of the invention.

FIG. 3 is a diagram showing an example of an exposure apparatus EX according to the present embodiment. In the present embodiment, gas Gb is supplied from the supply port 64.

In the present embodiment, viscosity of the gas Gb supplied from the supply port 64 is higher than that of the gas Ga in the outer space of the second member 60. In the present embodiment, the outer space of the second member 60 is the space 102 formed by the chamber member 104. In the present embodiment, the supply port 64 supplies the gas Gb with higher viscosity than that of the gas Ga supplied from the environment control apparatus 105. In the present embodiment, the gas Ga is air, and the gas Gb is argon gas.

The gas Gb supplied from the supply port 64 flows over the second face 61 toward the optical path K. The gas Gb supplied from the supply port 64 flows along the second face 61, and is suctioned from the recovery port 33. In addition, at least part of the gas Ga in the outer space of the second member 60 is also suctioned from the recovery port 33 via the second gap W2. The gas Ga suctioned from the recovery port 33 passes through a gap between the gas Gb flowing over the second face 61 and the upper face of the object (substrate P).

The gas Gb forms a gaseous film (layer) over the second face 61. The gas Gb has higher viscosity than that of the gas Ga. For this reason, the flowing rate of the gas Gb is lower than that of the gas Ga in the second gap W2. Accordingly, between the surface (lower face) of the layer of the gas Gb and the upper surface of the object, a gap in which the gas Ga flows is formed. By executing a suctioning operation on the recovery port 33 (suctioning operation of the gas Ga) in the state in which the gap between the surface of the gas Gb and the upper face of the object is set to be sufficiently small, a difference in pressure between the outer space and the inner space of the second member 60 can be increased.

Third Embodiment

Next, a third embodiment will be described. In the following description, the same reference symbols are given to the same or equivalent constituent components as those in the above-described embodiment, and description thereof will be simplified or omitted.

Figure 4:
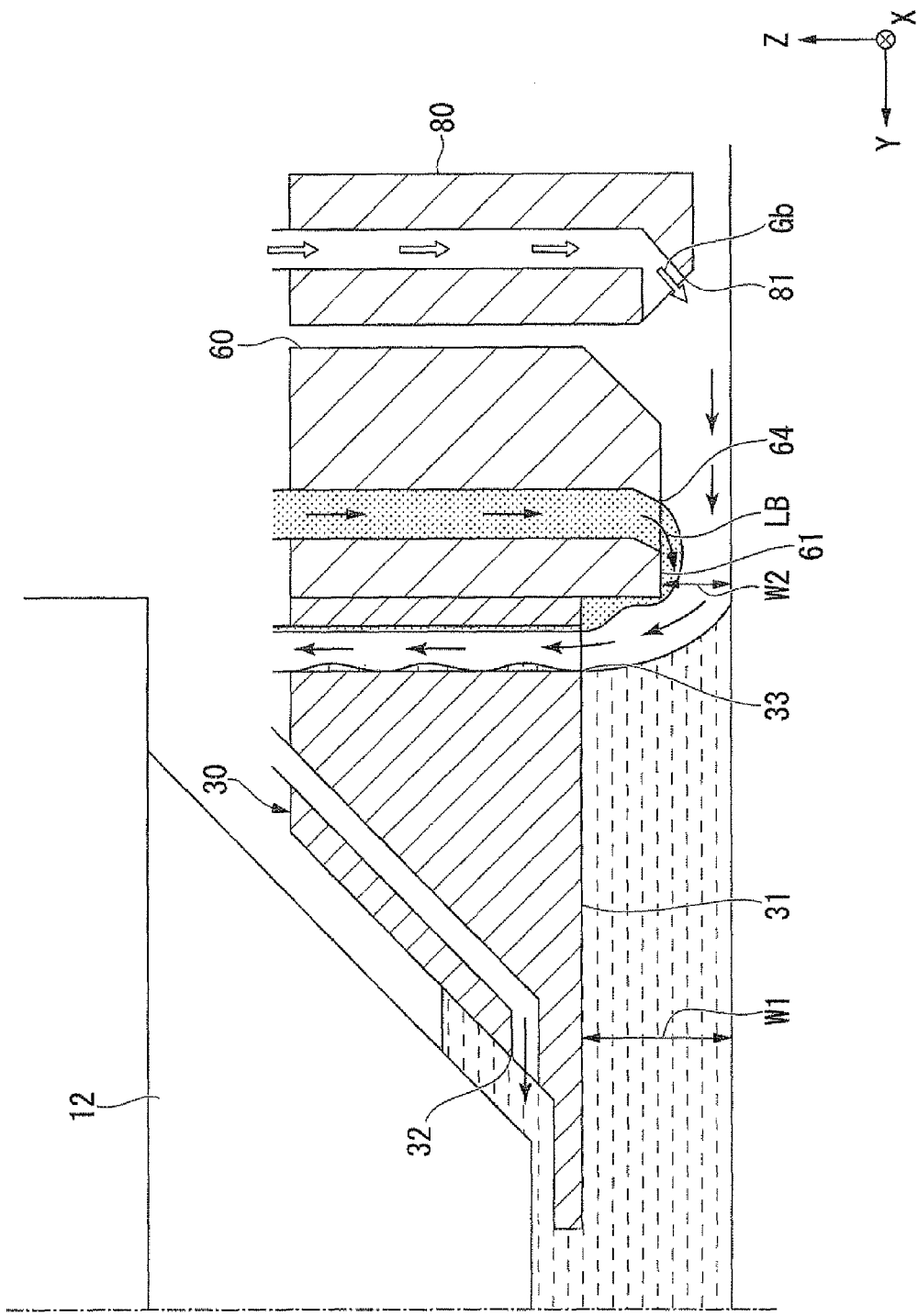
FIG. 4 is a diagram showing a part of an exposure apparatus according to a third embodiment of the invention.

FIG. 4 is a diagram showing an example of an exposure apparatus EX according to a third embodiment. In FIG. 4, the exposure apparatus EX is provided with a supply member 80 that is disposed at the outer side of the second member 60 with respect to the optical path K, and has a supply port 81 that supplies the gas Gb into the second gap W2. The recovery port 33 suctions the gas Gb from a supply port 81. Furthermore, the recovery port 33 may suction the gas Gb together with the gas Ga.

In the present embodiment, viscosity of the gas Gb supplied from the supply port 81 is higher than that of the gas Ga supplied from the environment control apparatus 105. In the present embodiment, the gas Ga is air, and the gas Gb is argon gas.

The gas Gb having higher viscosity is supplied from the supply port 81, and by having at least part of the gas Gb suctioned via the second gap W2 from the recovery port 33, a difference in pressure between the outer space and the inner space of the second member 60 becomes larger. Accordingly, the outflow of the liquid LQ is suppressed.

Furthermore, the gas Gb supplied from the supply port 81 may be the gas Ga, and may have the same viscosity as that of the gas Ga. By causing gas to be supplied from the supply port 81, a difference in pressure between the outer space and the inner space of the second member 60 can be increased.

Furthermore, in the third embodiment, the liquid LB is supplied from the supply port 64, however, the gas Gb may be supplied from the supply port 64. In this case, the supply port 64 may supply gas with higher viscosity than that of the gas Gb supplied from the supply port 81.

In addition, in the present embodiment, the supply port 81 is provided at the supply member 80, however, the supply port 81 may be provided at the second member 60.

Figure 5:
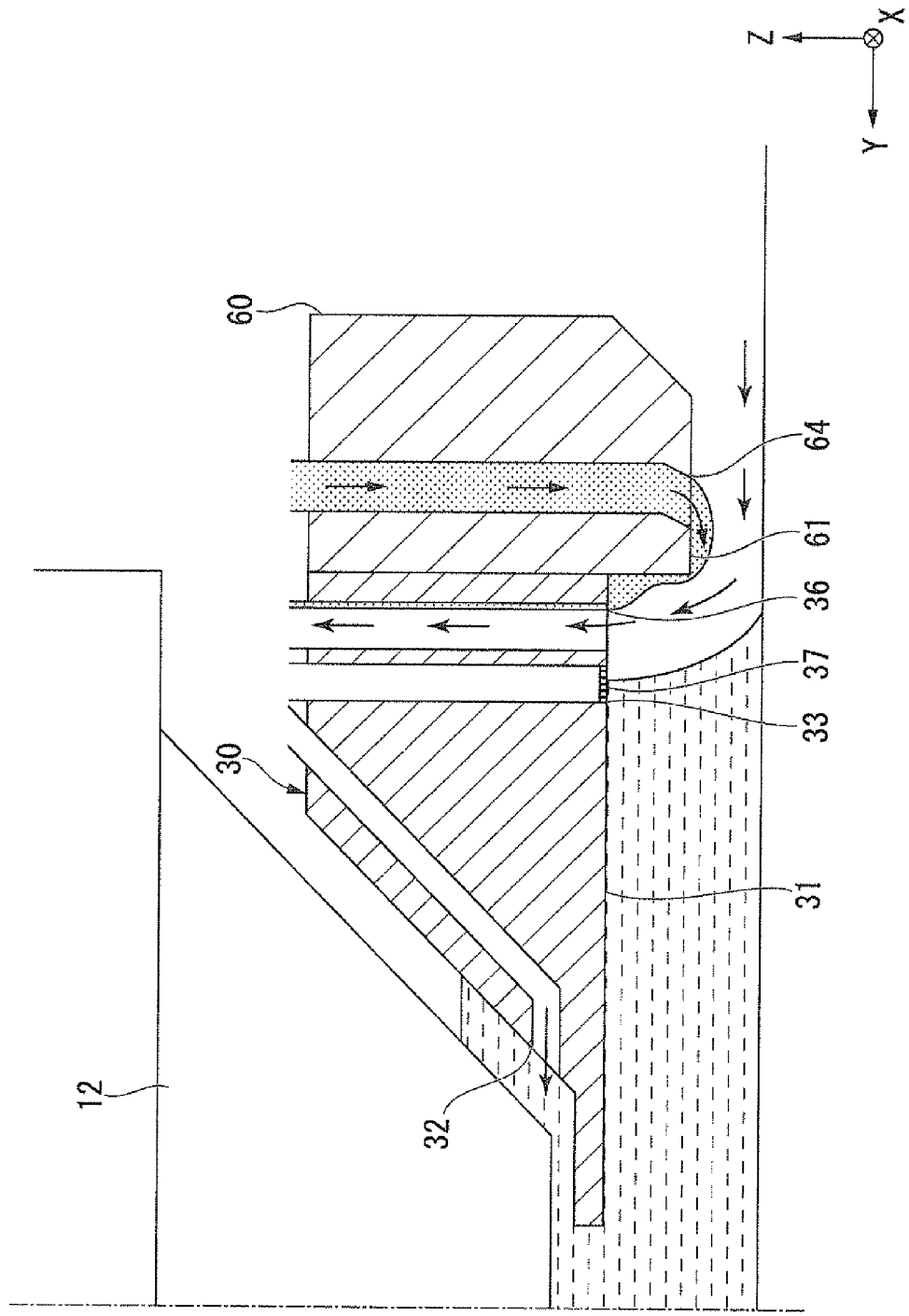
FIG. 5 is a diagram showing a part of an exposure apparatus according to the third embodiment of the invention.

Furthermore, in the first to third embodiments, a suction port 36 that recovers the liquid LB (or the gas Gb) supplied from the supply port 64 may be provided between the recovery port 33 and the second face 61, for example, as shown in FIG. 5. The fluid (both or either of the liquid LB and the gas Gb) supplied from the supply port 64 is recovered by the suction port 36 disposed between the recover port 33 and the second face 61.

Furthermore, when the suction port 36 is provided as shown in FIG. 5, a porous member 37 may be disposed at the recovery port 33. The liquid LQ on the substrate P may be recovered via holes of the porous member 37. Furthermore, the porous member 37 may be a plate-like member including a plurality of holes (openings or pores). Furthermore, the porous member 37 may be a mesh filter in which a plurality of small holes is formed in a mesh shape. Of course, even when the suction port 36 is provided, the porous member 37 may not be disposed at the recovery port 33.

Furthermore, the liquid LB may not be supplied at all times when the liquid immersion space LS is formed. For example, when the object (substrate P, or the like) moves (for example, when the object moves at a lower rate than the scanning rate of the substrate P) in a condition that the object facing the first member 30 does not cause leakage of the liquid LQ from the liquid immersion space LS, the liquid LB may be caused not to flow.

In addition, the liquid LB may be caused to flow not from all directions in the periphery of the optical path of the exposure light (periphery of the liquid immersion space LS). In other words, the liquid LB may be caused to flow toward the optical path of the exposure light only from some directions in the periphery of the optical path of the exposure light (periphery of the liquid immersion space LS). For example, the liquid LB may be caused to flow toward the optical path of the exposure light only from some directions in the periphery of the optical path of the exposure light (periphery of the liquid immersion space LS) in which a leakage of the liquid LQ from the liquid immersion space LS easily occurs. For example, when a plurality of supply ports 64 are provided in the periphery of the optical path of the exposure light (periphery of the liquid immersion space LS), and the object (substrate P, or the like) facing the first member 30 moves to a first direction, the liquid LB is supplied from some of the supply ports 64 positioned in the traveling direction, and when the object moves in a second direction, the liquid LB may be supplied only from some other supply ports 64 positioned in the traveling direction.

Furthermore, in the respective embodiments described above, the first member 30 and the second member 60 may be separated. When the first member 30 and the second member 60 are separated from each other, the first member 30 may be supported by a member different from the supporting mechanism 101. For example, the first member 30 may be supported by the body 100 via a supporting member different from the supporting mechanism 101, or may be supported by a supporting member which supports at least one optical element of the projection optical system PL. In addition, when the first member 30 and the second member 60 are separated from each other, at least one of the first member 30 and the second member 60 may be provided with a drive apparatus which is movable at least in one direction of the six directions of the X-axis, Y-axis, Z-axis, θX, θY, and θZ directions and the first member 30 and the second member 60 may be relatively moved using the drive apparatus.

In addition, only one portion of the first member 30 may come into contact with the second member 60, or the first member 30 and the second member 60 may be linked with each other by a linking member.

Figure 6:
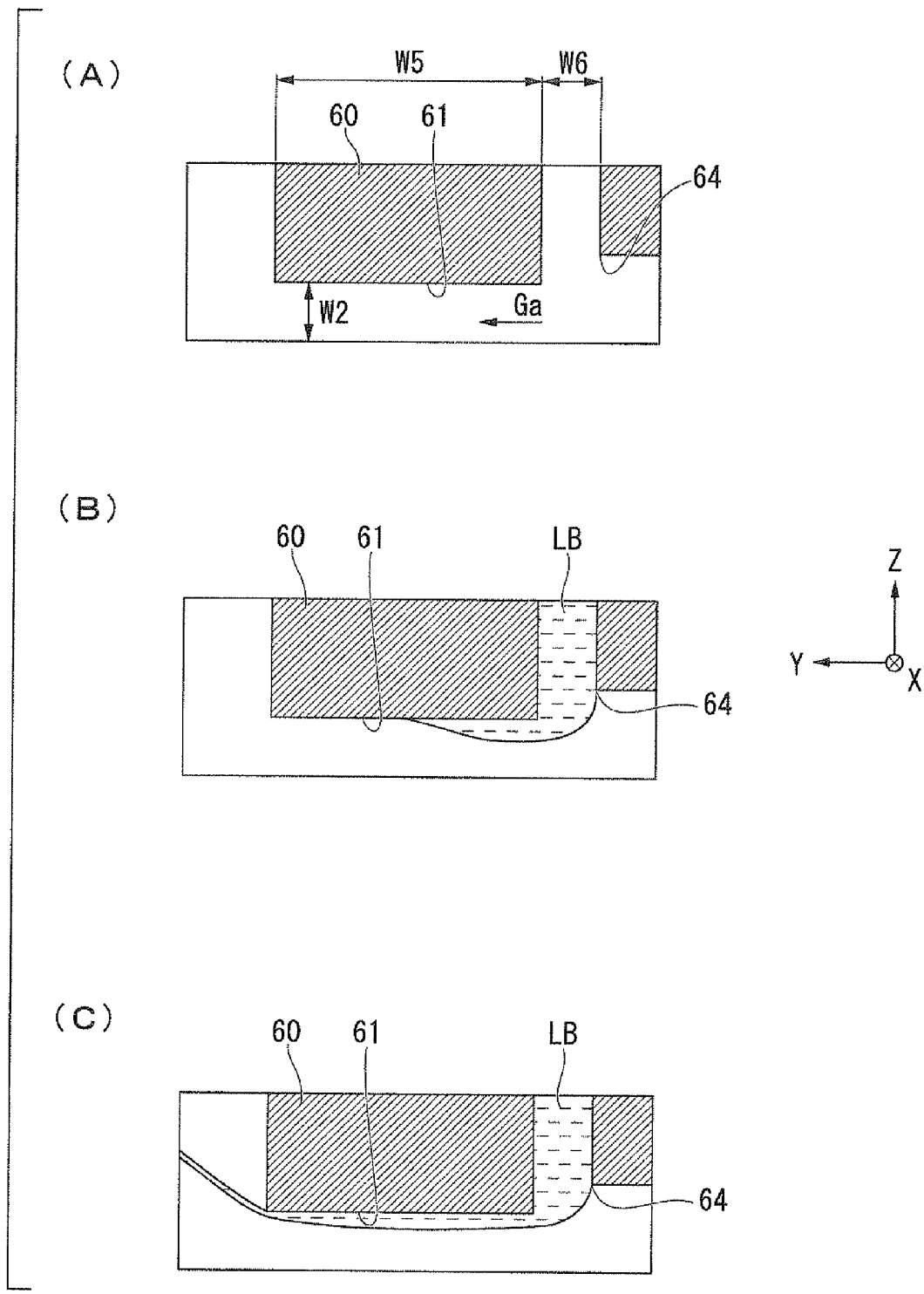
FIG. 6 is a diagram schematically showing an example of a state of the periphery of a second member.

FIG. 6 is a diagram schematically showing an example of a simulation result of the behavior of the liquid LB when the liquid LB is supplied from the supply port 64. FIG. 6(A) shows a state before the liquid LB is supplied from the supply port 64. FIG. 6(B) shows a state immediately after supply of the liquid LB from the supply port 64 is started. FIG. 6(C) shows a state after a predetermined time has passed from the start of the supply of the liquid LB from the supply port 64.

Furthermore, conditions of the simulation are as follows.
The gap W2 between the second face 61 and a face facing thereof: 0.3 mm
The dimension W5 of the second face 61 in the Y-axis direction (radiation direction with respect to the optical axis of the projection optical system PL): 2.0 mm
The dimension (diameter) W6 of the supply port 64 in the Y-axis direction (radiation direction with respect to the optical axis of the projection optical system PL): 0.5 mm
The injection volume of the liquid LB from the supply port 64: 10 liters per minute
The volume of the gas Ga flowing in the gap between the second face 61 and a face facing thereof: 200 liters per minute As shown in FIGS. 6(B) and 6(C), it is ascertained that the liquid LB supplied from the supply port 64 flows toward the recovery port 33 (or the suction port 36) (toward the +Y direction) along the second face 61, and a gap that is smaller than W2 can be formed below the liquid LB flowing along the second face 61.

And then, a difference in pressure between the inner and outer spaces of the second member 60 further increases by further recovering the gas Ga in the outer space of the second member 60 through the recovery port 33 in the state in which the liquid LB is being supplied. Accordingly, outflow of the liquid LQ in the liquid immersion space LS is suppressed.

Fourth Embodiment

Next, a fourth embodiment will be described. In the description below, the same reference numerals are given to the same or corresponding constituent portions as those in the above-described embodiments, and description thereof will be briefly provided or omitted.

Figure 7:
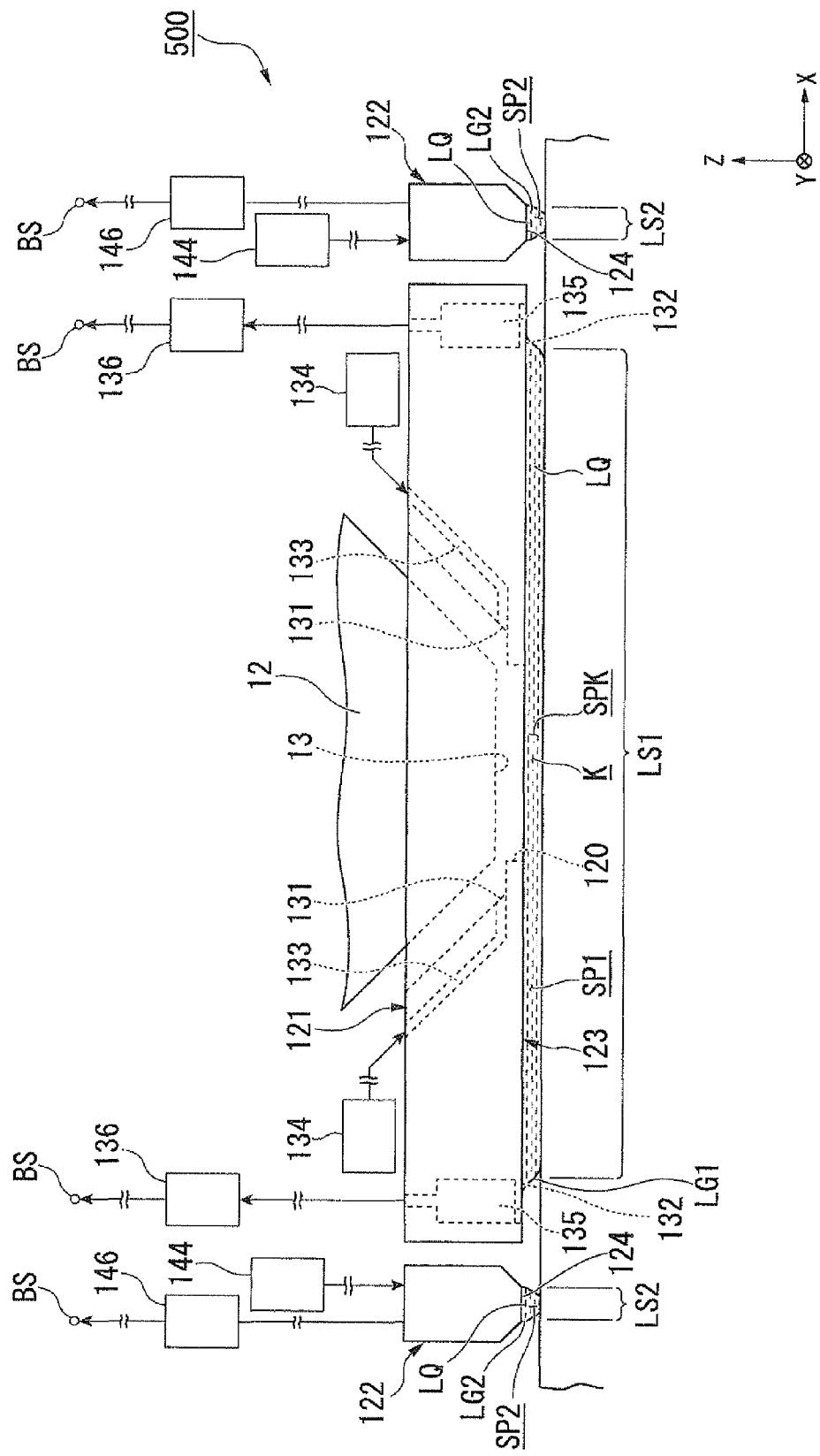
FIG. 7 is a diagram showing a part of an exposure apparatus according to a fourth embodiment of the invention.
Figure 8:
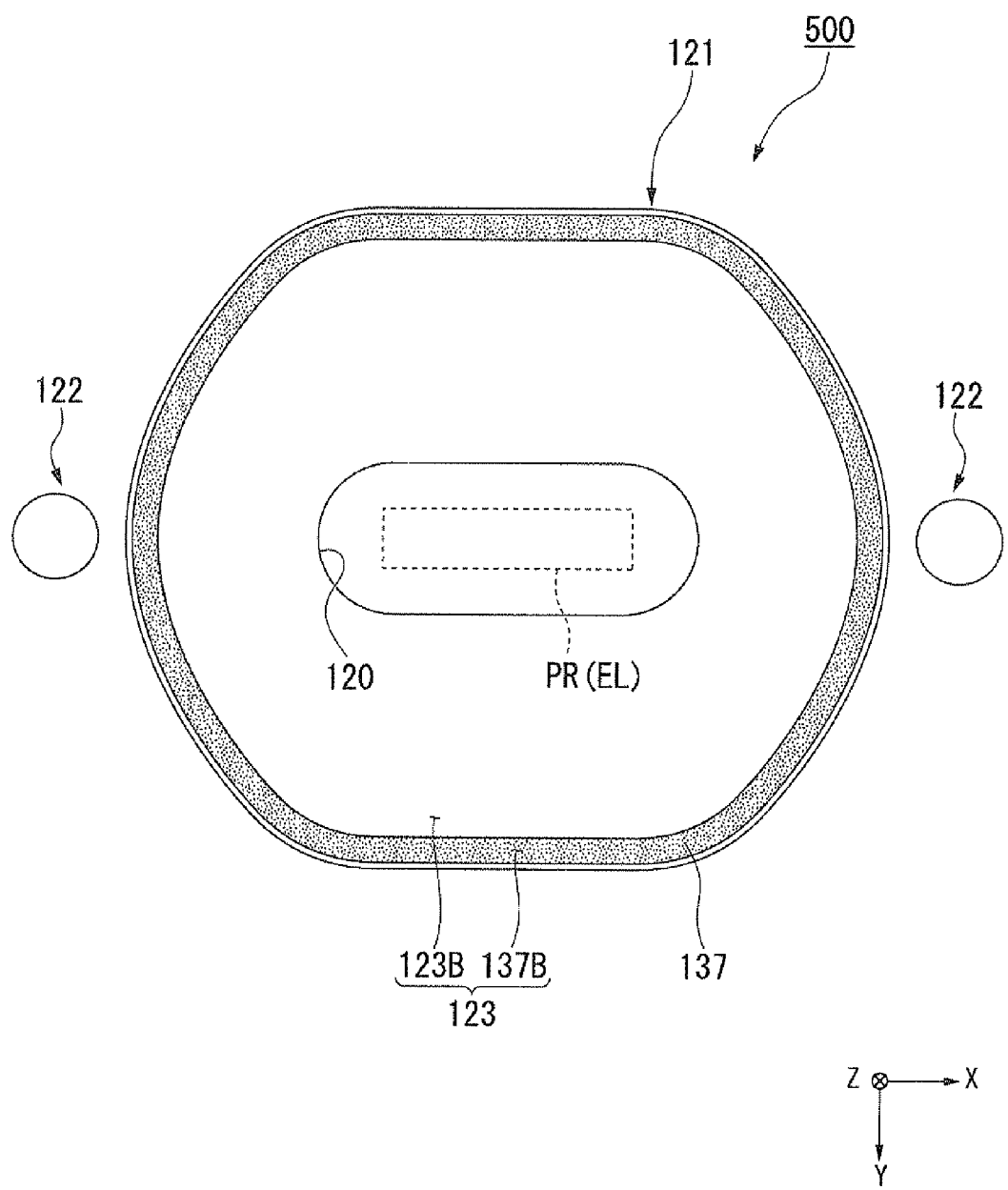
FIG. 8 is a diagram showing a part of an exposure apparatus according to a fourth embodiment of the invention.

FIG. 7 is a side view showing an example of an liquid immersion member 500 according to the present embodiment, and FIG. 8 is a view taken from the lower side (−Z side) of the liquid immersion member 500.

The liquid immersion member 500 is provided with a first liquid immersion member 121 which is disposed at at least a part of the periphery of a last optical element 12, and second liquid immersion member 122 that is disposed at the outside of the first liquid immersion member 121 with respect to the optical path K (the optical axis of the last optical element 12) of the exposure light EL emitted from the emission face 13. The first liquid immersion member 121 forms a liquid immersion space LS1 of the liquid LQ. The second liquid immersion member 122 can form liquid immersion space LS2 of the liquid LQ while being separate from the liquid immersion space LS1. The liquid immersion space LS1 is formed so that at least one part of thereof is formed at a first space SP1 which is below the first liquid immersion member 121. The liquid immersion space LS2 is formed so that at least one part of thereof is formed at a second space SP2 which is below the second liquid immersion member 122.

The last optical element 12, the first liquid immersion member 121, and the second liquid immersion member 122 are disposed at the space 102 (102A) of the chamber apparatus 103. The gas Ga is supplied to the space 102 from the air supply portions 105S of the environment control apparatus 105.

The first liquid immersion member 121 has a lower face 123. The second liquid immersion member 122 has a lower face 124. The lower faces 123 and 124 can be opposed to an object that can move below of the last optical element 12. The object that can move below of the last optical element 12 can be opposed to the emission face 13.

The object can be disposed at the projection region PR. The object can move within the X-Y plane including the projection region PR. The object can move below of the first liquid immersion member 121. The object can move below of the second liquid immersion member 122.

In the present embodiment, the object includes at least one of the substrate stage 2, the substrate P held by the substrate stage 2, and the measurement stage 3.

In the description below, the object that can move below of the last optical element 12 is set to be the substrate P. Note that, as described above, the object that can move below of the last optical element 12 may be at least one of the substrate stage 2 and the measurement stage 3, or may be an object other than the substrate P, the substrate stage 2, and the measurement stage 3.

The first liquid immersion member 121 forms the liquid immersion space LS1 of the liquid LQ so that the optical path K of the exposure light EL in the emission face 13 side is filled with the liquid LQ. The liquid immersion space LS1 is formed so that the optical path K between the emission face 13 and the upper face of the substrate P (object) is filled with the liquid LQ.

The first liquid immersion member 121 forms the liquid immersion space LS1 of the liquid LQ in at least a part of an optical path space SPK, which includes the optical path K at the emission face 13 side, and the first space SP1 at the lower face 123 side. The last optical element 12 and the first liquid immersion member 121 can hold the liquid LQ between the substrate P (object). The liquid immersion space LS1 is formed by the liquid LQ which is held between the last optical element 12 and the first liquid immersion member 121, and the substrate P. With the liquid LQ being held between the lower face 123 and the emission face 13 in one side and the upper face of the substrate P (object) in the other side, the liquid immersion space LS1 is formed so that the optical path K of the exposure light EL between the last optical element 12 and the substrate P is filled with the liquid LQ.

During exposure of the substrate P, the liquid immersion space LS1 is formed so that the optical path K of the exposure light EL irradiated on the substrate P is filled with the liquid LQ. When the substrate P is irradiated with the exposure light EL, the liquid immersion space LS1 is formed so that only a partial region of the surface of the substrate projection optical system, which includes the projection region projection portion, is covered by the liquid LQ.

In the present embodiment, at least one part of an interface (a meniscus or an edge) LG1 of the liquid LQ of the liquid immersion space LS1 is formed between the lower face 123 and the surface of the substrate P. In other words, the exposure apparatus EX of the present embodiment adopts a local liquid immersion method. The outside of the liquid immersion space LS1 (outside of the interface LG1) is a gas space.

In the present embodiment, the first liquid immersion member 121 is a ring-shaped member. In the present embodiment, one part of the first liquid immersion member 121 is disposed at the periphery of the last optical element 12. In addition, a part of the first liquid immersion member 121 is disposed at the periphery of the optical path K of the exposure light EL between the last optical element 12 and the substrate P.

The first liquid immersion member 121 may not be a ring-shaped member. For example, the first liquid immersion member 121 may be disposed at one part of the periphery of the last optical element 12 and the optical path K. The first liquid immersion member 121 may not be disposed at at least one part of the periphery of the last optical element 12. For example, the first liquid immersion member 121 may disposed at at least one part of the periphery of the optical path K between the emission face 13 and the substrate P and therefore not disposed at the periphery of the last optical element 12. The first liquid immersion member 121 may not be disposed at at least one part of the periphery of the optical path K between the emission face 13 and the substrate P. For example, the first liquid immersion member 121 may be disposed at at least one part of the periphery of the last optical element 12 and therefore not disposed at the periphery of the optical path K between the emission face 13 and the object.

The first liquid immersion member 121 is provided with supply ports 131 that supply the liquid LQ for forming the liquid immersion space LS1 and a recovery port 132 that recovers at least part of the liquid LQ of the liquid immersion space LS1.

The supply port 131 is disposed so as to face the optical path space SPK (optical path K). The supply port 131 is connected to a liquid supply apparatus 134 that can supply the liquid LQ via a supply flow path 133 which is formed in the inner side of the first liquid immersion member 121. The supply port 131 supplies the liquid LQ from the liquid supply apparatus 134 to the optical path space SPK (optical path K) in the emission face 13 side.

The first liquid immersion member 121 has a hole (opening) 120 that the emission face 13 faces. The exposure light EL emitted from the emission face 13 can be irradiated on the substrate P after passing through the opening 120. At least part of the liquid LQ that is supplied to the optical path space SPK from the supply port 131 is supplied onto the substrate P (onto the object) via the opening 120. In addition, at least part of the liquid LQ supplied to the optical path space SPK from the supply port 131 is supplied to the first space SP1 via the opening 120. In the present embodiment, the liquid LQ is supplied from the opening 120 to the first space SP1 below of the first liquid immersion member 121.

Recovery ports 132 are disposed so as to face the first space SP1. The substrate P (object) can be opposed to the recovery ports 132. The recovery ports 132 are connected to liquid recovery apparatus 136 that can recover (suction) the liquid LQ via a recovery flow path 135 which is formed in the inner side of the first liquid immersion member 121. The recovery ports 132 can recover (suction) at least a part of the liquid LQ in the first space SP1 between the first liquid immersion member 121 and the substrate P. The liquid LQ that flows into the recover flow paths 135 from the recovery ports 132 is recovered by the liquid recovery apparatus 136. The liquid recovery apparatus 136 is capable to connect the recovery ports 132 to a vacuum system BS.

In the present embodiment, the first liquid immersion member 121 includes a porous member 137. The porous member 137 has a plurality of holes (openings or pores) through which the liquid LQ can flow. The porous member 137 includes, for example, a mesh filter. The mesh filter is a porous member in which a plurality of small holes is formed in a mesh shape.

In the present embodiment, the porous member 137 is a plate-like member. The porous member 137 has a lower face 137B that can be opposed to the substrate P, an upper face that faces the recovery flow path 135 which is formed in the first liquid immersion member 121, and a plurality of holes formed so as to connect the upper face and the lower face 137B. In the present embodiment, the recovery port 132 includes holes of the porous member 137. The liquid LQ recovered through the holes (recovery port 132) of the porous member 137 flows through the recovery flow path 135.

In the present embodiment, both liquid LQ and gas in the first space SP1 are recovered (suctioned) from the porous member 137 (recovery port 132). Note that, recovery of gas may be restricted and substantially only the liquid LQ may be recovered via the porous member 137. It is not necessary to provide porous member 137.

In the present embodiment, by recovering the liquid LQ from the recovery ports 132 in parallel with the supply of the liquid LQ from the supply ports 131, the liquid immersion space LS1 of the liquid LQ is formed between the last optical element 12 and the first liquid immersion member 121 in one side and the substrate P in the other side. The liquid immersion space LS1 is formed by the liquid LQ supplied from the supply ports 131.

The lower face 123 is disposed at the periphery of the opening 120. In the present embodiment, at least a part of the lower face 123 is substantially parallel with the X-Y plane. At least a part of the lower face 123 may be inclined to the X-Y plane, or may include a curved face.

The lower face 123 includes a lower face 123B that is disposed at the periphery of the opening 120 and cannot recover the liquid LQ, and a lower face 137E of the porous member 137 that is disposed at the periphery of the lower face 123B and capable to recover the liquid LQ. The liquid LQ cannot pass through the lower face 123B. The lower face 123B is capable to hold the liquid LQ between itself and the substrate P.

In the present embodiment, the lower face 137B through which the liquid LQ can be recovered is disposed at the circumferential portion of the lower face 123. The lower face 137B is a ring-shape within the X-Y plane that is parallel to the lower face 123 (upper face of the substrate P). The lower face 123B through which the liquid LQ cannot be recovered is disposed at the inner side of the lower face 137B. In the present embodiment, the interface LG1 is disposed between the lower face 137B and the upper face of the substrate P.

The lower face 137B (recovery port 132) through which the liquid LQ can be recovered may be disposed at the periphery of the optical path K (opening 120).

The second liquid immersion member 122 is a member different from the first liquid immersion member 121. The second liquid immersion member 122 is separate from the first liquid immersion member 121. The second liquid immersion member 122 is disposed at a part of the periphery of the first liquid immersion member 121.

The second liquid immersion member 122 can form a liquid immersion space LS2 of the liquid LQ in at least a part of a second space SP2 which is below of the second liquid immersion member 122. The second space SP2 is a space in the lower face 124 side. The liquid immersion space LS2 is formed separate from the liquid immersion space LS1. The liquid immersion space LS2 is formed between the lower face 124 and the upper face of the substrate P (object). The second liquid immersion member 122 can hold the liquid LQ between itself and the substrate P (object). The liquid immersion space LS2 is formed by the liquid LQ held between the second liquid immersion member 122 and the substrate P. The liquid immersion space LS2 is formed in such a way that the liquid LQ is held between the lower face 124 in one side and the upper face of the substrate P (object) in the other side.

In the present embodiment, at least a part of an interface (a meniscus or an edge) LG2 of the liquid LQ in the liquid immersion space LS2 is formed between the lower face 124 and the upper face of the substrate P. The outside of the liquid immersion space LS2 (outside of the interface LG2) is a gas space.

The liquid immersion space LS2 is smaller than the liquid immersion space LS1. The scale of a liquid immersion space includes the volume of liquid that forms the liquid immersion space. In addition, the scale of a liquid immersion space includes the weight of liquid that forms the liquid immersion space. Further, the scale of a liquid immersion space includes, for example, the area of the liquid immersion space within a plane (X-Y plane) parallel to the surface (upper face) of the substrate P. Further, the scale of a liquid immersion space includes, for example, dimensions of the liquid immersion space with regard to a predetermined direction (for example, X-axis or Y-axis direction) within a plane (X-Y plane) parallel to the surface (upper face) of the substrate P.

In other words, within a plane (X-Y plane) parallel to the surface (upper face) of the substrate P, the liquid immersion space LS2 is smaller than the liquid immersion space LS1. The volume (weight) of the liquid LQ that forms the liquid immersion space LS2 is smaller than the volume (weight) of the liquid LQ that forms the liquid immersion space LS1. The dimensions of the liquid immersion space LS2 within the X-Y plane is smaller than those of the liquid immersion space LS1.

Since the liquid immersion space LS2 is smaller than the liquid immersion space LS1, when the substrate P (object) moves in the state where the liquid immersion spaces LS1 and LS2 are formed, some of the liquid LQ in the liquid immersion space LS2 is suppressed to move away from the liquid immersion space LS2 and move (flow out) to the outside of the second space SP2. In other words, since the liquid immersion space LS2 is smaller than the liquid immersion space LS1, the flow out of some of the liquid LQ in the liquid immersion space LS2 from the second space SP2 is suppressed further than the flow out of some of the liquid LQ in the liquid immersion space LS1 from the first space SP1.

In the present embodiment, two of the second liquid immersion member 122 are disposed at spaces in the periphery of the first liquid immersion member 121. In the present embodiment, the second liquid immersion members 122 are disposed at one side (+X side) and the other side (−X side) of the first liquid immersion member 121 with respect to the X-axis direction. The liquid immersion space LS2 is formed at one side (+X side) and the other side (−X side) of the liquid immersion space LS1 with respect to the X-axis direction.

The second liquid immersion member 122 may be disposed only at one side (+X side) or only at the other side (−X side) of the first liquid immersion member 121. The liquid immersion space LS2 may be disposed only at one side (+X side) or only in the other side (−X side) of the liquid immersion space LS1.

In the present embodiment, at least a part of the lower face 124 is substantially parallel to the X-Y plane. At least a part of the lower face 124 may be inclined to the X-Y plane, or may include a curved face.

In the present embodiment, the position (height) of the lower face 123 and the position (height) of the lower face 124 with respect to the Z-axis direction are substantially equal. That is, the distance between the lower face 123 and the upper face of the substrate P (object) is substantially equal to the distance between the lower face 124 and the upper face of the substrate P (object).

The lower face 124 may be disposed at a position lower than that of the lower face 123. That is, the distance between the lower face 124 and the upper face of the substrate P (object) may be shorter than the distance between the lower face 123 and the upper face of the substrate P (object). The lower face 124 may be disposed at a position higher than that of the lower face 123. That is, the distance between the lower face 124 and the upper face of the substrate P (object) may be longer than the distance between the lower face 123 and the upper face of the substrate P (object).

Figure 9:
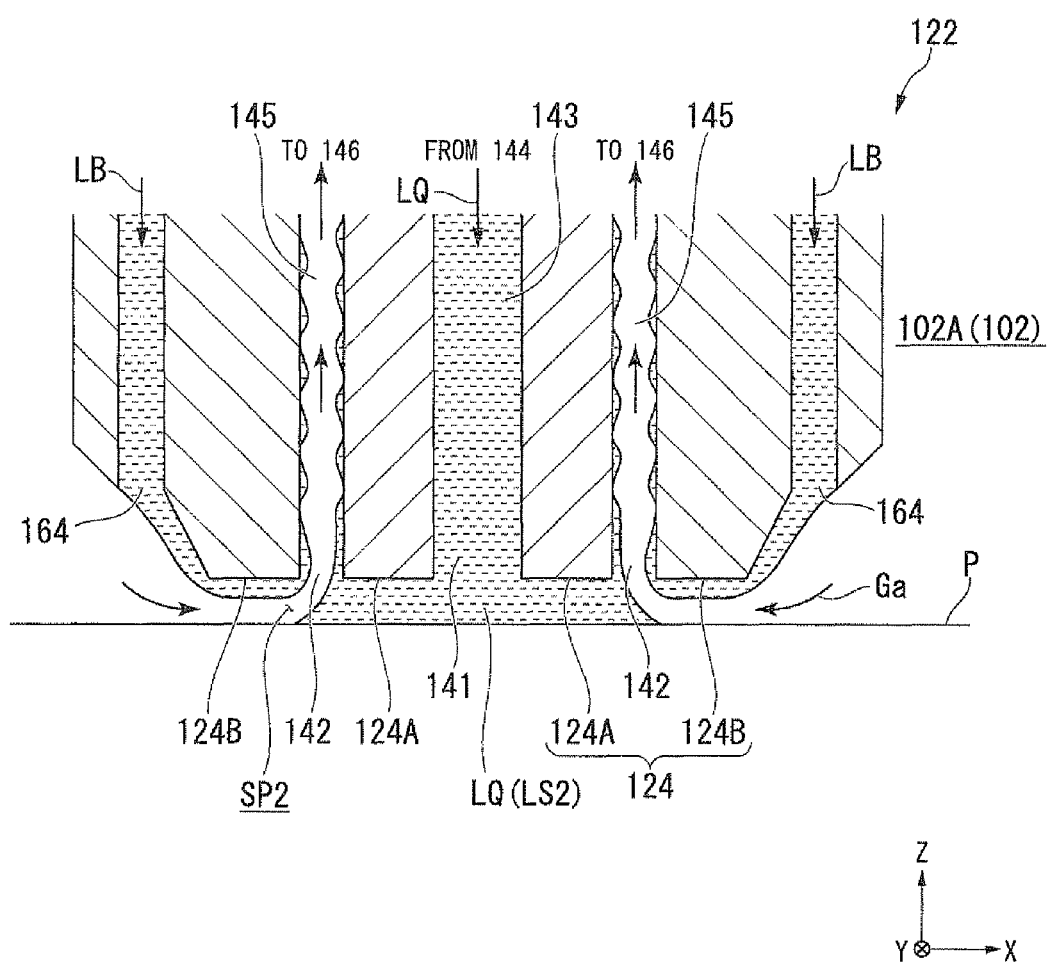
FIG. 9 is a diagram showing a part of an exposure apparatus according to a fourth embodiment of the invention.
Figure 10:
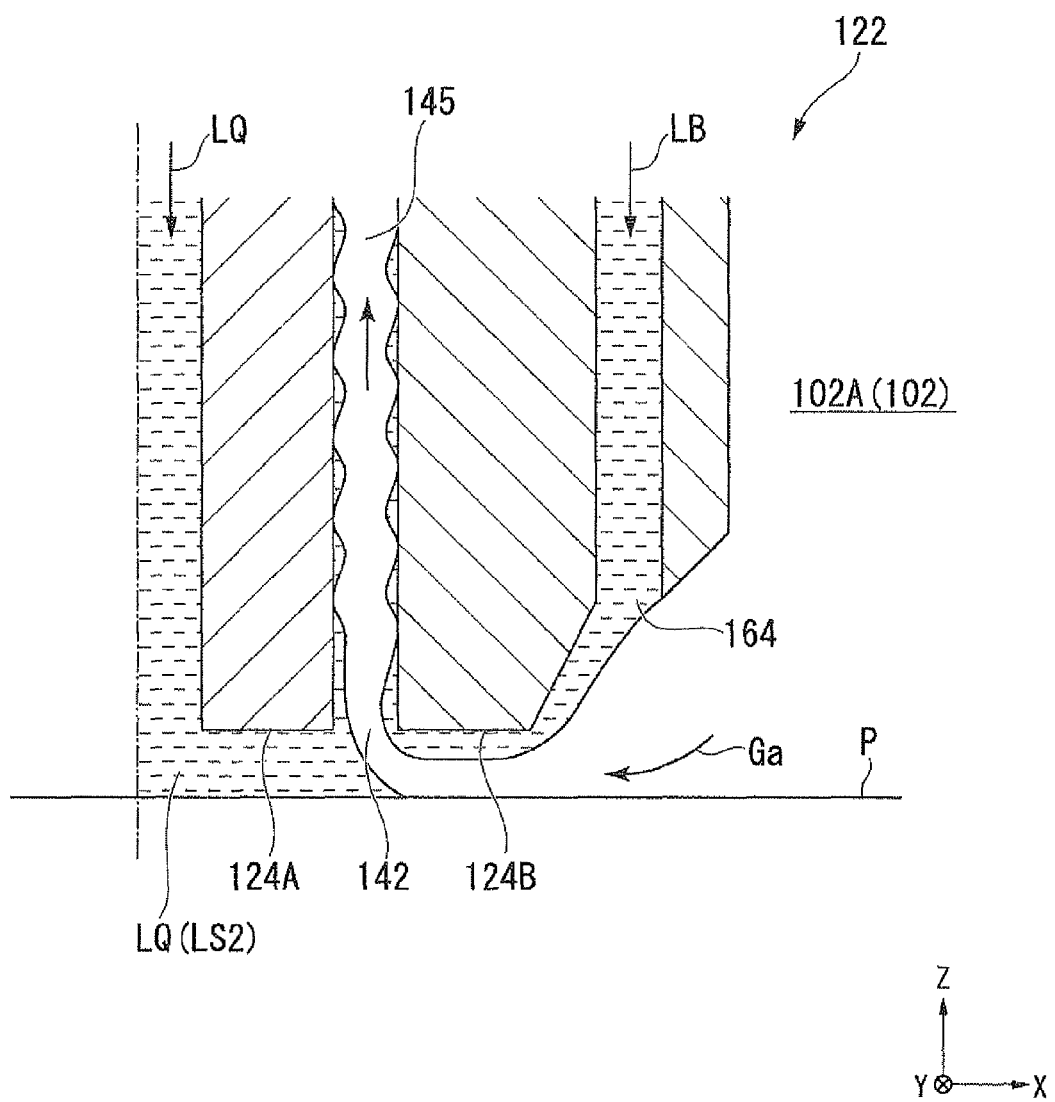
FIG. 10 is a diagram showing a part of an exposure apparatus according to a fourth embodiment of the invention.

FIG. 9 is a cross-sectional view showing an example of the second liquid immersion member 122. FIG. 10 is a diagram showing an enlarged part of FIG. 9.

The second liquid immersion member 122 has first faces 124A that are opposed to the upper face of the substrate P (object) through a first gap and hold the liquid LQ between the upper face of the substrate P (object), second faces 124B that are disposed at the outer sides of the first faces 124A with respect to the first faces 124A and are opposed to the upper face of the substrate P (object) through a second gap, supply ports 164 that are disposed at the outer sides of the second faces 124E with respect to the center of first faces 124A and that supply fluid, and suction ports (recovery ports) 142 that are disposed between the first faces 124A and the second faces 124B, and suction at least part of the gas Ga in the space 102 (102A) in the outside of the second faces 124E through a gap between the second faces 124B and the upper face of the substrate P (object).

The second liquid immersion member 122 includes a supply port 141 that supplies the liquid LQ for forming the liquid immersion space LS2. The supply port 141 is disposed at at least a part of the lower faces 124 (first faces 124A). The supply port 141 is disposed at the center of the first faces 124A. The first faces 124A are disposed at the periphery of the supply port 141.

The recovery ports (suction ports) 142 recover at least part of the liquid LQ of the liquid immersion space LS2.

The recovery ports 142 suction the liquid LQ together with the gas Ga from the environment control apparatus 105. The recovery ports 142 are disposed so as to surround the supply port 141. In the present embodiment, the shape of the recovery ports 142 within the X-Y plane is a ring shape. A plurality of recovery ports 142 may be disposed around the supply port 141. That is, the plurality of recovery ports 142 may be disposed at a scattering manner around the supply port 141.

The supply port 141 is disposed so as to face the second space SP2 which is below of the second liquid immersion member 122. The substrate P (object) is capable to oppose the supply port 141. The supply port 141 is capable to supply the liquid LQ to the second space SP2.

In the present embodiment, the recovery ports 142 are disposed so as to face the second space SP2 which is below of the second liquid immersion member 122. The substrate P (object) can be opposed to the recovery ports 142. The recovery ports 142 are disposed at at least parts of the first faces 124A. The recovery ports 142 can recover at least part of the liquid LQ of the second space SP2. The recovery ports 142 can recover gas in the second space SP2. In the present embodiment, the recovery ports 142 recover the liquid LQ together with the gas Ga. At least part of fluid (both or either of the liquid LQ and/or gas) in the second space SP2 is recovered from the recovery ports 142.

The supply port 141 is connected to a liquid supply apparatus 144 that can supply the liquid LQ via a supply flow path 143 formed in the second liquid immersion member 122. The supply port 141 supplies the liquid LQ from the liquid supply apparatus 144 to the second space SP2.

As shown in FIG. 7, in the present embodiment, the liquid supply apparatuses 144 are respectively connected to the second liquid immersion member 122 at one side and the second liquid immersion member 122 at the other side.

The recovery port 142 is connected to a fluid recovery apparatus 146 that can recovery (suction) the liquid LQ (or gas) via the recovery flow path 145 formed in the second liquid immersion member 122. The recovery port 142 can recover (suction) at least part of the liquid LQ in the second space SP2 between the second liquid immersion member 122 and the substrate P. The liquid LQ recovered from the second space SP2 below of the second liquid immersion member 122 flows via the recovery flow path 145. The liquid LQ flowing from the recovery port 142 into the recovery flow path 145 is recovered by the fluid recovery apparatus 146. The fluid recovery apparatus 146 can cause the recovery port 142 to be connected to a vacuum system BS.

The fluid recovery apparatus 146 suction the liquid LQ so that the path of the gas Ga can be maintained in the recovery flow path 145.

As shown in FIG. 7, in the present embodiment, the fluid recovery apparatus 146 are respectively connected to the second liquid immersion member 122 in one side and the second liquid immersion member 122 in the other side.

In the present embodiment, by recovering the liquid LQ from the recovery port 142 in parallel with the supply of the liquid LQ from the supply port 141, the liquid immersion space LS2 is formed between the second liquid immersion member 122 in one side and the substrate P in the other side by the liquid LQ. The liquid immersion space LS2 is formed by the liquid LQ supplied from the supply port 141.

The supply ports 164 are disposed at the outer sides of the second face 124B with respect to the center (supply port 141) of the first face 124A.

In the present embodiment, the supply ports 164 supply the liquid LB. The liquid LB supplied from the supply ports 164 may be the same kind as the liquid LQ (water) supplied from the supply port 141 for forming the liquid immersion space LS2, or may be a different kind.

The liquid LB supplied from the supply ports 164 may have a higher viscosity than the liquid LQ of the liquid immersion space LS2. For example, the liquid LQ may be water, and the liquid LB may be decalin. The liquid LB may be water that has a different grade of cleanness from that of the liquid LQ. For example, the liquid LQ may be water with a first grade of cleanness and the liquid LB may be water with a second grade of cleanness that is lower than the first grade of cleanness. In addition, the liquid LB may be water with different temperature from that of the liquid LQ. For example, the liquid LQ may be water with a first temperature, and the liquid LB may be water with a second temperature that is higher than the first temperature.

In the present embodiment, the liquid LB supplied from the supply ports 164 flows on the second faces 124B toward the recovery ports 142. In the present embodiment, the liquid LB supplied from the supply ports 164 flows while coming into contact with at least a part of the second faces 124B, and then is recovered (suctioned) from the recovery ports 142. In the present embodiment, films of the liquid LB are formed at the second faces 124B.

In the present embodiment, the recovery ports 142 suction (or discharge) at least part of the gas Ga in the space 102 at the outer side of the second faces 124B via the gap between the second faces 124B and the upper face of the substrate P (object). That is, the recovery ports 142 suction at least part of the gas Ga from the environment control apparatus 105 via a second gap.

The recovery ports 142 suction the gas Ga in the space 102 via a gap between the surface (upper face) of the liquid LB that is supplied from the supply ports 164 and then flows on the second face 124B and the upper face of the substrate P (object). That is, the gas Ga suctioned from the recovery ports 142 passes via the gap between the liquid LB flowing on the second face 124B and the upper face of the object (substrate P).

In the present embodiment, at least either of the liquid supply amount of the liquid LB supplied from the supply ports 164 per unit time or the gas recovery amount of gas recovered from the recovery ports 142 per unit time is set so that the liquid LB supplied from the supply ports 164 flows on the second face 124B without coming into contact with the upper face of the opposing object. That is, at least either of the liquid supply amount of the liquid. LB supplied from the supply ports 164 per unit time or the gas recovery amount of gas recovered from the recovery ports 142 per unit time is set so that a gap is formed between the liquid LB flowing on the second face 124B and the upper face of the substrate P (object).

In the present embodiment, the recovery ports 142 also can suction at least part of the liquid LQ supplied between the first face 124A and the upper face of the substrate P (object). For example, during exposure of the substrate P, the recovery ports 142 can suction both of the liquid LQ and the gas Ga. The fluid recovery apparatus 146 suctions the liquid LQ via the recovery ports 142 so that the path of the gas Ga is maintained in the recovery flow path 145.

In addition, in the present embodiment, the recovery ports 142 can suction both of the liquid LB and the gas Ga. The fluid recovery apparatus 146 suctions the liquid LB via the recovery ports 142 so that the path of the gas Ga is maintained in the recovery flow path 145.

As described above, in the present embodiment, the outflow of the liquid LQ in the liquid immersion space LS2 is suppressed.

In the present embodiment, liquid is set to be supplied from the supply ports 164. However, gas Gb may be supplied from the supply ports 164. The gas Gb supplied from the supply ports 164 may be a different kind from the gas Ga supplied from the environment control apparatus 105. For example, the viscosity of the gas Gb may be higher than that of the gas Ga. For example, the gas Ga may be air and the gas Gb may be argon gas.

In the present embodiment, members having the recovery ports 142 and the supply ports 164 may be different from each other. That is, the supply port 141 and the recovery ports 142 may be disposed at a first member, and the supply ports 164 may be disposed at a second member. In addition, members having the first faces 124A and the second faces 124B may be different from each other. That is, the first faces 124A may be disposed at a first member, and the second faces 124B may be disposed at a second member.

The second liquid immersion member 122 described in the fourth embodiment may be disposed at the periphery of at least one of the first members (first liquid immersion members) described in the first to third embodiments.

Furthermore, in the respective embodiments described above, the optical path K on the emission side (image plane side) of the last optical element 12 of the projection optical system PL is designed to be filled with the liquid LQ. However, the projection optical system PL may be a projection optical system in which the optical path on the incidence side (object face side) of the last optical element 12 is also filled with the liquid LQ as disclosed in, for example, International Publication No. 2004/019128.

Furthermore, in the respective embodiments described above, water is used as the liquid LQ for exposure, but liquid other than water may also be used. As the liquid LQ, it is preferable to have a transmissive property with respect to the exposure light EL, to have a high refractive index with respect to the exposure light EL, and to have stability against the projection optical system PL or a film such as a photosensitive material (photoresist) that is used to form the surface of the substrate P. For example, as the liquid LQ, hydrofluoroether (FIFE), perfluoropolyether (PFPE), Fomblin® oil, or the like can also be used. In addition, as the liquid LQ, a variety kind of fluids, for example, a supercritical fluid can also be used.

Furthermore, as the substrate P in the respective embodiments described above, a glass substrate for a display apparatus, a ceramic wafer for a thin film magnetic head, the original plate of a reticle or a mask (synthetic quartz, silicon water) used in an exposure apparatus, or the like, as well as a semiconductor wafer for manufacturing a semiconductor apparatus, is applied.

The exposure apparatus EX can also be applied not only to a step-and-scan type scanning exposure apparatus (scanning stepper) that performs scanning exposure of the pattern of the mask M by moving the mask M and the substrate P in a synchronized manner, but also to a step-and-repeat type projection exposure apparatus (stepper) in which the patterns of the mask M are collectively exposed in a state in which the mask M and the substrate P stand still and the substrate P is caused to sequentially move stepwise.

Furthermore, in the step-and-repeat type exposure, after a reduced image of a first pattern is transferred onto the substrate P using a projection optical system in a state in which the first pattern and the substrate P substantially stand still, a reduced image of a second pattern may be collectively exposed on the substrate P in a partial overlapping manner with the first pattern using the projection optical system in a state in which the second pattern and the substrate P substantially stand still (a stitch type collective exposure apparatus). In addition, the aspects of the invention can also be applied to a step-and-stitch type exposure apparatus, as a stitch type exposure apparatus, in which at least two patterns are transferred onto the substrate P in a partially overlapping manner and the substrate P is sequentially moved.

In addition, as disclosed in, for example, U.S. Pat. No. 6,611,316, the aspects of the invention can also be applied to an exposure apparatus in which synthesize the patterns of two masks on a substrate via a projection optical system, and performs a double-exposure substantially at the same time at an one shot region on the substrate by a single scanning exposure, or the like. In addition, the aspects of the invention can also be applied to a proximity type exposure apparatus, a mirror projection aligner, or the like.

Figure 11:
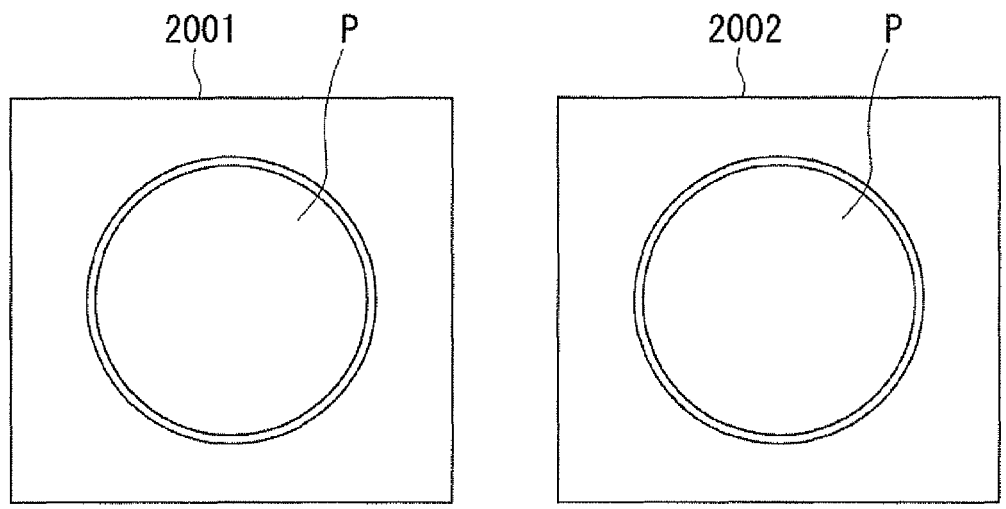
FIG. 11 is a diagram showing an example of a substrate stage.

In addition, the aspects of the invention can also be applied to a twin stage type exposure apparatus provided with a plurality of substrate stages as disclosed in U.S. Pat. Nos. 6,341,007, 6,208,407, 6,262,796, and the like. As shown in FIG. 11, for example, when the exposure apparatus EX is provided with two substrate stages 2001 and 2002, an object that can be disposed so as to be opposed to the emission face 13 includes at least one of a substrate stage, a substrate held by the substrate stage, the other substrate stage, and a substrate held by the other substrate stage.

In addition, it can also be applied to an exposure apparatus provided with a plurality of substrate stages and measurement stages.

The type of the exposure apparatus EX is not limited to an exposure apparatus for manufacturing a semiconductor device used for exposing a semiconductor device pattern onto the substrate P, and can be broadly applied to an exposure apparatus for manufacturing a display or a liquid display device, an exposure apparatus used for manufacturing thin-film magnetic heads, imaging devices (CCDs), micromachines, MEMS, DNA chips, reticles, masks, or the like.

Furthermore, in the above-described embodiments, a light-transmissive mask for forming a predetermined light blocking pattern (a phase pattern, or a dimming pattern) on a light-transmissive substrate has been used, but instead of these masks, a variable shaped mask (also called an electronic mask, an active mask, or an image generator) used for forming a transmissive pattern, a reflective pattern, or a light-emitting pattern based on electronic data of a pattern to be exposed, as described in, for example, U.S. Pat. No. 6,778, 257 may be used. In addition, instead of a variable shaped mask which includes a non-light emitting type image display device, a pattern forming apparatus which includes a self-light emitting type image display device may be provided.

In the respective embodiments described above, an exposure apparatus provided with the projection optical system PL has been exemplified. However, the aspects of the invention can be applied to an exposure apparatus and an exposure method in which the projection optical system PL is not used. For example, by forming a liquid immersion space between an optical member such as a lens and a substrate, the substrate can be irradiated with exposure light via the optical member.

In addition, as disclosed in, for example, International Publication No. 2001/035168, the aspects of the invention can also be applied to an exposure apparatus (lithography system) which performs exposure of a line-and-space pattern onto the substrate P by forming interference fringes on the substrate P.

The exposure apparatus EX in the above-described embodiments is manufactured through assembly so that various sub-systems including respective constituent components secure predetermined mechanical, electrical and chemical precision. In order to secure such various kinds of precision, adjustment in order to attain optical precision for various kinds of optical systems, adjustment in order to attain mechanical precision for various kinds of mechanical systems, and adjustment in order to attain electrical precision for various kinds of electric systems are performed before and after the assembly. A process of assembling various kinds of sub-systems into the exposure apparatus includes mechanical connection between the various kinds of sub-systems, wiring connection of electric circuits, piping connection of atmospheric pressure circuits, and the like. It is needless to say that there are individual processes of assembling respective sub-systems before the process of assembling the various kinds of sub-systems into the exposure apparatus. When the process of assembling the various kinds of sub-systems into the exposure apparatus is completed, comprehensive adjustment is performed so as to secure various kinds of precision as a whole exposure apparatus. Furthermore, it is desirable for the exposure apparatus to be manufactured in a clean room of which a temperature, a degree of cleanness, and the like are controlled.

Figure 12:
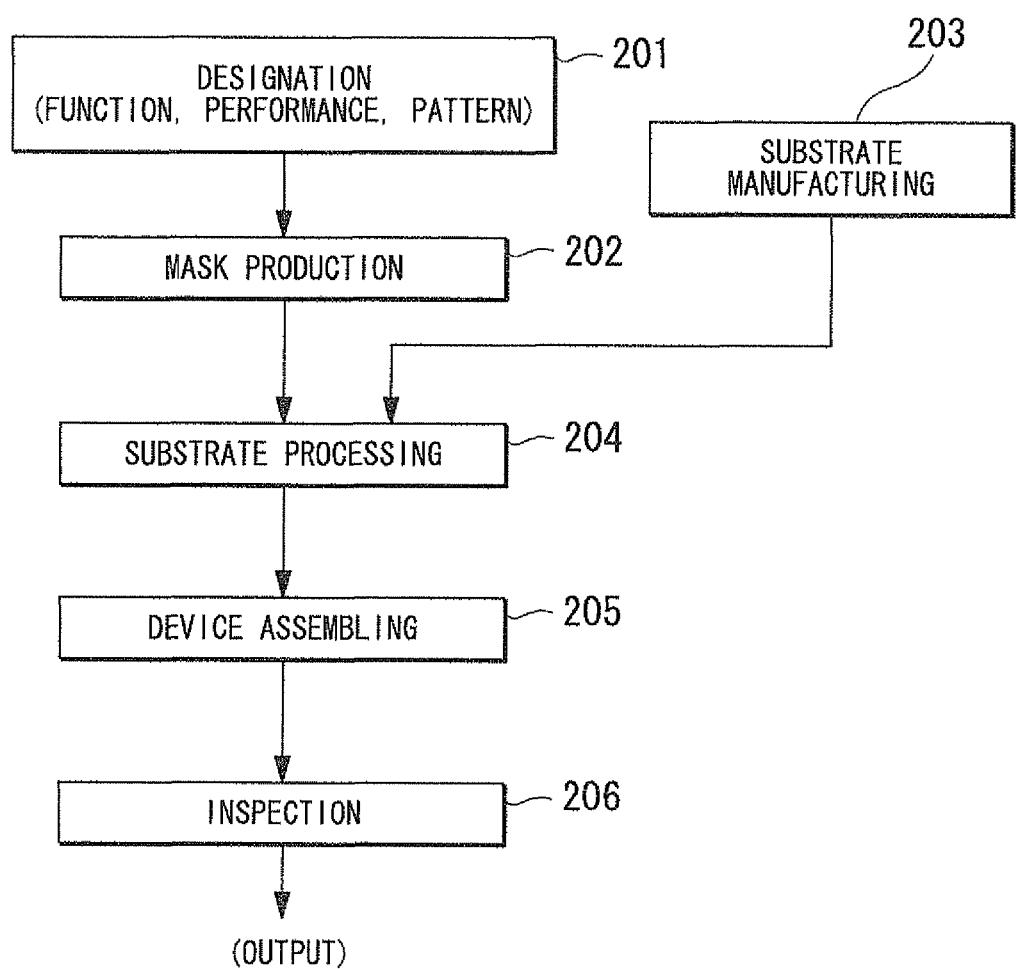
FIG. 12 is a flowchart showing an example of a device manufacturing process.

A microdevice such as a semiconductor device, or the like is manufactured by, as shown in FIG. 12, step 201 in which the function and performance of the microdevice are designed, step 202 in which a mask (reticle) is produced based on the designing step, step 203 in which a substrate that is a base material of the device is manufactured, substrate processing step 204 including substrate processing (exposure process) which includes exposure of the substrate of the pattern of the mask by exposure light and developing the exposed substrate, device assembling step 205 (including processes such as dicing, bonding, packaging, and the like), inspection step 206, and the like.

Furthermore, the conditions of the above-described respective embodiments can be appropriately combined. In addition, there is a case in which some constituent elements are not used. Further, as long as laws and regulations permit, all the disclosures of the publications and U.S. patents relating to exposure apparatuses or the like, which are referenced in the above-described embodiments and modifications, are incorporated as a part of this description.

What is claimed is:

1. An exposure apparatus that exposes a substrate with exposure light through a first liquid, comprising:
    a first member that is disposed at least in a part of a periphery of an optical path of the exposure light, and has a first face that faces an upper face of an object through a first gap and holds the first liquid between the upper face of the object and the first face;
    a second member that is disposed at an outer side of the first face with respect to the optical path and has a second face facing the upper face of the object through a second gap;
    a first supply port that is disposed at an outer side of the second face with respect to the optical path and supplies a second liquid biased from the second face toward the upper face of the object; and
    a first suction port that is disposed between the first face and the second face, and suctions at least part of gas in an outer space of the second member with respect to the optical path via a gap between the second face and the upper face of the object, wherein the first suction port, while suctioning the second liquid, suctions the gas in the outer space to keep the second liquid from dropping down from the second face to the upper face of the object and to maintain a gas passage between the second face and the upper face of the object.

2. The exposure apparatus according to claim 1, wherein viscosity of the second liquid supplied from the first supply port is higher than viscosity of gas in the outer space of the second member.

3. The exposure apparatus according to claim 1, further comprising:
    a chamber apparatus that has an environment control apparatus which supplies gas to an inner space where at least an optical member, which emits the exposure light, the first member and the second member are disposed,
    wherein the first suction port suctions the gas from the environment control apparatus.

4. The exposure apparatus according to claim 1, further comprising:
    a second supply port that is disposed at an outer side of the second member with respect to the optical path and supplies gas to the second gap,
    wherein the first suction port suctions the gas supplied from the second supply port.

5. The exposure apparatus according to claim 1, wherein the liquid supplied from the first supply port is different from a liquid through which the exposure light passes.

6. The exposure apparatus according to claim 5, wherein the liquid supplied from the first supply port has higher viscosity than the first liquid.

7. The exposure apparatus according to claim 1, further comprising:
    a second suction port that is disposed between the first suction port and the second face, and recovers the second liquid supplied from the first supply port.

8. The exposure apparatus according to claim 1, wherein the first suction port suctions the gas via a gap between a surface of the second liquid, which is supplied from the first supply port and flows over the second face, and the upper face of the object.

9. The exposure apparatus according to claim 8, wherein a dimension of the gap between the surface of the second liquid and the upper face of the object is 0.2 mm or less.

10. The exposure apparatus according to claim 9, wherein the dimension of the gap between the surface of the second liquid and the upper face of the object is 0.1 mm or larger and 0.2 mm or less.

11. The exposure apparatus according to claim 8, wherein the dimension of the gap between the surface of the second liquid and the upper face of the object is smaller than a dimension of the first gap.

12. The exposure apparatus according to claim 8,
    wherein the first suction port is disposed so as to face the object, and
    wherein a dimension of a third gap between the first suction port and the upper face of the object is larger than a dimension of the gap between the surface of the second liquid and the upper face of the object.

13. The exposure apparatus according to claim 1, wherein the first suction port is disposed at the first member.

14. The exposure apparatus according to claim 1, wherein the first suction port suctions at least part of the first liquid between the first face and the object.

15. The exposure apparatus according to claim 1, wherein the first gap is smaller than the second gap.

16. A device manufacturing method comprising:
exposing a substrate using the exposure apparatus according to claim 1; and
developing the exposed substrate.

17. An exposure apparatus that exposes a substrate with exposure light through a first liquid of a first liquid immersion space, comprising:
an optical member having an emission face from which the exposure light is emitted;
a first liquid immersion member that is disposed at at least part of a periphery of an optical path of the exposure light and forms the first liquid immersion space of the first liquid; and
a second liquid immersion member that is disposed at an outer side of the first liquid immersion member with respect to the optical path, and is capable to form a second liquid immersion space of a second liquid separated from the first liquid immersion space,
wherein the second liquid immersion member has a first face that is opposed to an upper face of an object through a first gap, a second face that is disposed at an outer side of the first face and opposed to the upper face of the object through a second gap, a first supply port that is disposed at an outer side of the second face and supplies, a third liquid, and a first suction port that is disposed between the first face and the second face, and suctions at least part of gas in an outer space of the second face through a gap between the second face and the upper face of the object, and
wherein the second liquid immersion member has a second supply port from which the second liquid is supplied, the first face being disposed between the second supply port and the first suction port.

18. The exposure apparatus according to claim 17, further comprising:
a chamber apparatus that has an environment control apparatus which supplies gas to an inner space where at least an optical member, which emits the exposure light, the first liquid immersion member, and the second liquid immersion member are disposed,
wherein the first suction port suctions the gas from the environment control apparatus.

19. The exposure apparatus according to claim 17, wherein the third liquid supplied from the first supply port is different from the second liquid.

20. The exposure apparatus according to claim 19, wherein the third liquid supplied from the first supply port has higher viscosity than the second liquid.

21. The exposure apparatus according to claim 17, wherein the first suction port suctions the gas through the gap between a surface of the third liquid, which is supplied from the first supply port and flows on the second face, and the upper face of the object.

22. The exposure apparatus according to claim 17, wherein the first suction port suctions the third liquid supplied from the second supply port and the second liquid supplied from the first supply port.

23. The exposure apparatus according to claim 17, further comprising:
a fluid suction apparatus that is connected to the first suction port through a suction flow path,
wherein the second and third liquid flows in the suction flow path so that a path of the gas is maintained in the suction flow path.

24. A liquid holding method used in an exposure apparatus that exposes a substrate with exposure light through a first liquid on the substrate, comprising;
holding the first liquid between an upper face of the substrate and a first face of a first member, the first member being disposed at least in a part of a periphery of an optical path of the exposure light and faces the upper face of the substrate through a first gap;
supplying a second liquid from a first supply port that is disposed at an outer side of a second face of a second member, which is disposed at an outer side of the first face with respect to the optical path and faces the upper face of the substrate through a second gap, the second liquid being biased from the second face toward the upper face of the substrate; and
suctioning at least part of gas in an outer space of the second member with respect to the optical path from a first suction port, which is disposed between the first face and the second face, via a gap between the second liquid flowing over the second face and the upper face of the substrate, wherein first suction port, while suctioning the second liquid, suctions the gas in the outer space to keep the second liquid from dropping down from the second face to the upper face of the object and to maintain a gas passage between the second face and the upper face of the object.

25. The liquid holding method according to claim 24, wherein the second liquid supplied from the first supply port flows over the second face toward the optical path.

26. The liquid holding method according to claim 24, wherein the gas suctioned from the first suction port passes through a gap between the second liquid flowing over the second face and the upper face of the substrate.

27. The liquid holding method according to claim 24, wherein the second liquid is recovered from a second suction port which is disposed between the first suction port and the second face.

28. The liquid holding method according to claim 24, wherein the second liquid is recovered from the first suction port.

29. The liquid holding method according to claim 24, wherein, after suctioning from the first suction port is started, supply of the second liquid from the first supply port is started.

30. The liquid holding method according to claim 24, wherein, at least one of a supply volume of the second liquid supplied from the first supply port per unit time and a suction volume of the gas recovered from the first suction port per unit time are set so that the second liquid supplied from the first supply port flows over the second face toward the first suction port without coming into contact with the upper surface of the substrate.

31. The liquid holding method according to claim 24, wherein, at least one of a supply volume of the second liquid supplied from the first supply port per unit time and a suction volume of the gas recovered from the first suction port per unit time are set so that the gap is formed between the second liquid that is supplied from the first supply port and flows over the second face toward the first suction port, and the upper face of the substrate.

32. A device manufacturing method comprising:
exposing a substrate via at least part of liquid held using the liquid holding method according to claim 24; and
developing the exposed substrate.

* * * * *